(12) United States Patent
Johnson et al.

(10) Patent No.: US 8,544,289 B2
(45) Date of Patent: *Oct. 1, 2013

(54) EXHAUST AIR REMOVAL SYSTEM

(75) Inventors: Rollie R. Johnson, Chesterfield, MO (US); Neil Rasmussen, Concord, MA (US)

(73) Assignee: Schneider Electric IT Corporation, West Kingston, RI (US)

( * ) Notice: Subject to any disclaimer, the term of this patent is extended or adjusted under 35 U.S.C. 154(b) by 242 days.

This patent is subject to a terminal disclaimer.

(21) Appl. No.: 12/540,757

(22) Filed: Aug. 13, 2009

(65) Prior Publication Data

US 2009/0308579 A1    Dec. 17, 2009

Related U.S. Application Data

(63) Continuation of application No. 10/303,641, filed on Nov. 25, 2002, now Pat. No. 7,752,858.

(51) Int. Cl.
    F25D 17/04     (2006.01)
    F25D 23/12     (2006.01)
    H05K 7/20      (2006.01)
    H05K 5/00      (2006.01)

(52) U.S. Cl.
    USPC ............ 62/186; 62/259.2; 361/695; 454/184

(58) Field of Classification Search
    USPC ...... 236/49.3; 62/259.2; 454/184; 361/696, 361/686, 752, 790, 701; 165/80.3
    See application file for complete search history.

(56) References Cited

U.S. PATENT DOCUMENTS 3,102,184 A    8/1963    Sherron
4,352,274 A    10/1982   Anderson et al.

(Continued)

FOREIGN PATENT DOCUMENTS

CA    2234439 A1    11/1998
DE    101 28 367 A1    1/2003

(Continued)

OTHER PUBLICATIONS

Partial International Search Report for PCT/US03/37625 mailed Jun. 1, 2004.

(Continued)

*Primary Examiner* — Chen Wen Jiang
(74) *Attorney, Agent, or Firm* — Lando & Anastasi, LLP

(57) ABSTRACT

An exhaust air removal system and method for use with a rack or enclosure containing equipment is provided. The system and method are configured for removal of exhaust air vented from equipment during operation to thereby remove heat from the equipment. In one aspect, the system includes a fan unit preferably configured to serve as a back door of an equipment rack or enclosure and configured to provide access to an interior of the rack or enclosure. The fan unit provides multiple fans coupled to internal exhaust ducts that are arranged to draw and to remove exhaust air vented from rack-mounted equipment. The fan unit is further configured to vent exhaust air to an area external to a rack or enclosure, such as an external exhaust duct or plenum. Removal of hot and warm exhaust air vented from rack-mounted equipment enables the equipment to operate effectively, drawing sufficient amounts of cooling air to meet its cooling requirements. The fan unit is constructed for portability and for easy attachment to and removal from a rack or enclosure, providing flexibility in handling equipment exhaust needs.

14 Claims, 15 Drawing Sheets

(56) References Cited

U.S. PATENT DOCUMENTS

| | | |
|---|---|---|
| 4,774,631 A | 9/1988 | Okuyama et al. |
| 4,851,965 A | 7/1989 | Gabuzda et al. |
| 5,063,477 A | 11/1991 | Paggen et al. |
| 5,210,680 A | 5/1993 | Scheibler |
| 5,409,419 A | 4/1995 | Euchner et al. |
| 5,414,591 A | 5/1995 | Kimura et al. |
| 5,440,450 A | 8/1995 | Lau et al. |
| 5,497,288 A | 3/1996 | Otis et al. |
| 5,540,548 A | 7/1996 | Eberhardt et al. |
| 5,544,012 A | 8/1996 | Koike |
| 5,657,641 A | 8/1997 | Cunningham et al. |
| 5,718,628 A | 2/1998 | Nakazato et al. |
| 5,910,045 A | 6/1999 | Aoki et al. |
| 5,914,858 A | 6/1999 | McKeen et al. |
| 5,982,618 A | 11/1999 | Roos |
| 5,999,403 A | 12/1999 | Neustadt |
| 6,000,232 A | 12/1999 | Witten-Hannah et al. |
| 6,052,282 A | 4/2000 | Sugiyama et al. |
| 6,075,698 A | 6/2000 | Hogan et al. |
| 6,101,459 A | 8/2000 | Tavallaei et al. |
| 6,104,607 A | 8/2000 | Behl |
| 6,145,502 A | 11/2000 | Lyons et al. |
| 6,164,369 A | 12/2000 | Stoller |
| 6,198,628 B1 | 3/2001 | Smith |
| 6,222,729 B1 | 4/2001 | Yoshikawa |
| 6,252,770 B1 | 6/2001 | Yu et al. |
| 6,288,897 B1 | 9/2001 | Fritschle et al. |
| 6,305,180 B1 | 10/2001 | Miller et al. |
| 6,317,320 B1 | 11/2001 | Cosley et al. |
| 6,368,064 B1 | 4/2002 | Bendikas et al. |
| 6,375,561 B1 | 4/2002 | Nicolai et al. |
| 6,406,257 B1 | 6/2002 | Houdek |
| 6,412,292 B2 | 7/2002 | Spinazzola et al. |
| 6,459,579 B1 | 10/2002 | Farmer et al. |
| 6,462,944 B1 | 10/2002 | Lin |
| 6,463,997 B1 | 10/2002 | Nicolai et al. |
| 6,494,050 B2 | 12/2002 | Spinazzola et al. |
| 6,535,382 B2 | 3/2003 | Bishop et al. |
| 6,557,357 B2 | 5/2003 | Spinazzola et al. |
| 6,565,428 B2 | 5/2003 | Hsiao |
| 6,574,970 B2 | 6/2003 | Spinazzola et al. |
| 6,611,428 B1 | 8/2003 | Wong |
| 6,668,565 B1 | 12/2003 | Johnson et al. |
| 6,682,159 B2 | 1/2004 | Compagnucci |
| 6,704,196 B1 | 3/2004 | Rodriguez et al. |
| 6,704,199 B2 | 3/2004 | Wiley |
| 6,722,151 B2 | 4/2004 | Spinazzola et al. |
| 6,724,624 B1 | 4/2004 | Dodson |
| 6,745,579 B2 | 6/2004 | Spinazzola et al. |
| 6,778,386 B2 | 8/2004 | Garnett et al. |
| 6,788,535 B2 | 9/2004 | Dodgen et al. |
| 6,819,560 B2 | 11/2004 | Konshak et al. |
| 6,822,859 B2 | 11/2004 | Coglitore et al. |
| 6,889,752 B2 | 5/2005 | Stoller |
| 6,927,977 B2 | 8/2005 | Singer |
| 7,033,267 B2 | 4/2006 | Rasmussen |
| 7,112,131 B2 | 9/2006 | Rasmussen et al. |
| 7,500,911 B2 | 3/2009 | Johnson et al. |
| 7,752,858 B2 * | 7/2010 | Johnson et al. ................. 62/186 |
| 7,862,410 B2 * | 1/2011 | McMahan et al. ............ 454/184 |
| 8,087,979 B2 | 1/2012 | Rasmussen |
| 8,210,914 B2 | 7/2012 | McMahan et al. |
| 2001/0029163 A1 | 10/2001 | Spinazzola et al. |
| 2002/0007643 A1 | 1/2002 | Spinazzola et al. |
| 2002/0059804 A1 | 5/2002 | Spinazzola et al. |
| 2002/0095971 A1 | 7/2002 | Pawson |
| 2002/0108386 A1 | 8/2002 | Spinazzola et al. |
| 2002/0121555 A1 | 9/2002 | Cipolla et al. |
| 2003/0235035 A1 | 12/2003 | Wintersteen et al. |
| 2004/0099747 A1 | 5/2004 | Johnson et al. |
| 2004/0160720 A1 | 8/2004 | Yamanashi et al. |
| 2004/0227435 A1 | 11/2004 | Rasmussen |
| 2005/0048896 A1 | 3/2005 | Shaben |
| 2005/0159098 A1 | 7/2005 | Johnson et al. |
| 2005/0170770 A1 | 8/2005 | Johnson et al. |
| 2006/0276121 A1 | 12/2006 | Rasmussen |
| 2007/0129000 A1 | 6/2007 | Rasmussen et al. |
| 2007/0171613 A1 | 7/2007 | McMahan et al. |
| 2011/0045759 A1 | 2/2011 | Rasmussen et al. |
| 2011/0143644 A1 | 6/2011 | McMahan et al. |

FOREIGN PATENT DOCUMENTS

| | | |
|---|---|---|
| EP | 0 741 269 B1 | 11/2001 |
| EP | 1 705 977 B1 | 9/2006 |
| FR | 2 193 303 | 2/1974 |
| FR | 2 831 019 A1 | 4/2003 |
| GB | 2 354 066 A | 3/2001 |
| JP | 51-55922 | 4/1976 |
| JP | 54-56503 | 4/1979 |
| JP | 59-151478 | 10/1984 |
| JP | 62-174397 | 11/1987 |
| JP | 1-163541 | 6/1989 |
| JP | 3-85797 | 4/1991 |
| JP | 4-85785 | 7/1992 |
| JP | 5-15423 | 1/1993 |
| JP | 5-160592 | 6/1993 |
| JP | 6-272694 | 9/1994 |
| JP | 7-98781 | 4/1995 |
| JP | 8-285421 | 11/1996 |
| JP | 9-64555 | 3/1997 |
| JP | 10-339500 | 12/1998 |
| JP | 11-184570 | 7/1999 |
| JP | 2000-47757 | 2/2000 |
| JP | 2000-112574 | 4/2000 |
| JP | 2000-315883 | 11/2000 |
| JP | 2001-231673 A | 8/2001 |
| JP | 2001-257496 | 9/2001 |
| WO | 01/62060 A1 | 8/2001 |
| WO | 01/86217 A1 | 11/2001 |
| WO | 02/16854 A1 | 2/2002 |
| WO | 02/093093 A1 | 11/2002 |
| WO | 2004/049773 A2 | 6/2004 |

OTHER PUBLICATIONS

International Search Report for PCT/US2004/013867 mailed May 4, 2005.
International Search Report for PCT/US2005/005148 mailed Jun. 17, 2005.
Liebert, "Foundation—60Hz", May 2002, 9 pages.
Liebert, "DataCool—60Hz", May 2002, 2 pages.
Enterprise 4000/4500/Stor Rack Kit Installation Instructions, Oct. 1, 2001.
Website: http://www.sharkrack.com/cart/display/php?category id=16&product is=25.
Website: http://www.edpeurope.com/sharkrack.html.
European Search Report for EP 08 16 4463 dated Mar. 1, 2010.
Extend European Search Report for European Application No. 10180950.7 dated Sep. 21, 2011.

* cited by examiner

EXHAUST AIR REMOVAL SYSTEM

RELATED APPLICATIONS

This application is a continuation of prior U.S. application Ser. No. 10/303,641, filed Nov. 25, 2002, which is incorporated by reference herein in its entirety.

FIELD OF THE INVENTION

The invention relates to an exhaust air removal system for removing thermal exhaust air produced by equipment during operation.

BACKGROUND OF THE INVENTION

Communications and information technology equipment is commonly designed for mounting to racks and for housing within enclosures. Equipment racks and enclosures are used to contain and to arrange communications and information technology equipment, such as servers, CPUs, internetworking equipment and storage devices, in small wiring closets as well as equipment rooms and large data centers. An equipment rack can be an open configuration and can be housed within a rack enclosure. A standard rack typically includes front-mounting rails to which multiple units of equipment, such as servers and CPUs, are mounted and stacked vertically, and typically has a footprint of about 23 by 42 inches. The equipment capacity of a standard rack relates to the height of the mounting rails. The height is set at a standard increment of 1.75 inches, which is expressed as "U" units or the "U" height capacity of a rack. A typical U height or value of a rack is 42 U. A standard rack at any given time can be sparsely or densely populated with a variety of different components as well as with components from different manufacturers.

Most rack-mounted communications and information technology equipment consumes electrical power and generates heat. Heat produced by rack-mounted equipment can have adverse effects on the performance, reliability and useful life of the equipment components. In particular, rack-mounted equipment housed within an enclosure is particularly vulnerable to heat build-up and hot spots produced within the confines of the enclosure during operation. The amount of heat generated by a rack is dependent on the amount of electrical power drawn by equipment in the rack during operation. Heat output of a rack can vary from a few watts per U unit of rack capacity to over 1 kW per U unit, depending on the number and the type of components mounted to the rack. Users of communications and information technology equipment add, remove, and rearrange rack-mounted components as their needs change and new needs develop. The amount of heat a given rack or enclosure can generate, therefore, can vary considerably from a few tens of watts up to about 10 kW.

Rack-mounted equipment typically cools itself by drawing air along a front side or air inlet side of a rack or enclosure, drawing air through its components, and subsequently exhausting air from a rear or vent side of the rack or enclosure. Air flow requirements to provide sufficient air for cooling, thus, can vary considerably as a result of the number and the type of rack-mounted components and the configurations of racks and enclosures. Generally, most configurations and designs of information technology equipment require cooling air to flow at a rate of about 180 cubic feet per minute (cfm) per kilowatt of power consumed such that a rack drawing 10 kW of electrical power would require an air flow rate of about 1,800 cfm.

Equipment rooms and data centers are typically equipped with an air conditioning or cooling system that supplies and circulates cool air to rack-mounted equipment and enclosures. Many air conditioning or cooling systems, such as the system disclosed in U.S. Patent Application Publication No. U.S. 2001/0029163 A1, application Ser. No. 09/784,238, require that an equipment room or data center have a raised floor construction to facilitate the system's air conditioning and circulation functions. Referring to FIG. 1, the cooling system of the referenced application provides cool air by means of closed-loop air circulation and includes a raised floor 2 disposed above a base floor 5 of an equipment room. The raised floor 2 and the base floor 5 define an air passageway 6 into which an air cooling unit 14 delivers cool air. The air passageway 6 is connected to one portion of an equipment rack or enclosure 8 and is configured to channel cool air through the passageway to front portions of equipment 7 housed in the enclosure 8. Cool air flows across the equipment 7 into a plenum 8c and ascends through the plenum 8c into a plurality of ducts 24. Exhaust air vents from the ducts 24 into a return plenum 4. The return plenum 4 is connected to the air cooling unit 14 and is configured to deliver exhaust air to the air cooling unit 14 for cooling and subsequent recirculation to the equipment room.

Alternatively, air cooling systems and methods use open floor tiles and floor grills or vents to deliver cool air from the air passageway disposed below the raised floor of an equipment room. Open floor tiles and floor grills or vents are typically located in front of equipment racks and enclosures, and along aisles between rows of racks and enclosures arranged side-by-side.

The cooling systems and methods that require a raised floor construction typically do not efficiently meet the cooling requirements of rack-mounted equipment. In particular, racks that include high power equipment having a thermal exhaust air output above 5 kW and up to 10 kW present a particular challenge for such systems and methods. A raised floor construction typically provides an open floor tile or a floor grill or vent having a venting area of about 12 by 12 inches and is configured to deliver from about 200 to about 500 cfm of cool air. The air flow rate from the venting area is dependent on such factors as static air pressure and the presence of other floor tiles such that, in practice, a floor tile typically delivers from about 100 to about 200 cfm of air. A rack of high power equipment drawing up to 10 kW and requiring an air flow of approximately 1,800 cfm, therefore, would need at least about 3.5 to about 5 open floor tiles, grills or vents disposed around the rack's perimeter to supply sufficient cool air to meet its cooling requirements. Such a floor configuration would be difficult to achieve in equipment rooms crowded with racks and enclosures, and impossible to implement if racks and enclosures are arranged side-by-side in rows. Air cooling systems and methods that incorporate raised floor configurations, thus, are typically only used with racks and enclosures spaced apart to provide sufficient floor area to accommodate multiple open floor tiles, grills or vents. For typical rack spacing, this places a limit on the density of equipment that can be achieved. In addition, such air cooling systems and methods must supply cold air through open floor tiles, grills or vents to meet the cooling requirements of equipment having high thermal exhaust air output.

Equipment rooms and data centers are often reconfigured to meet new and/or different equipment needs that require individual racks and enclosures to be relocated and/or replaced. In this context, raised floor air cooling systems and methods are inflexible and can typically only be reconfigured and/or retrofitted to service rearranged, relocated and/or newly installed equipment racks at considerable cost. Raised floor configurations cannot easily and inexpensively accommodate the manner by which users typically deploy equipment racks and reconfigure equipment rooms and data centers to meet their new or changing needs.

In addition, cooling systems and methods that require raised floor construction lack physical flexibility and portability to operatively account for a wide variation in electrical power consumption between different racks and enclosures in an equipment room, and, in particular, between racks and enclosures located in the same row. Cooling systems and methods that rely upon raised floor air passageways and open floor tiles, grills or vents to supply cool air cannot easily and inexpensively vary or concentrate cool air to those high power racks that consume relatively large amounts of electrical power and have a high thermal air exhaust output. In addition, newly installed equipment may draw more electrical power than replaced or existing equipment to create thermal problem areas in functioning equipment rooms.

Further, cooling systems and methods that depend upon raised floor construction cannot physically accommodate specific areas in equipment rooms with thermal problems. For example, such systems and methods cannot overcome exhaust problems where hot and warm exhaust air is not effectively vented from an equipment room and/or returned to an air conditioning or cooling system without considerable expense to reconfigure and/or retrofit the air systems and/or the racks and enclosures. Such exhaust problems can also cause hot and warm exhaust air to recirculate to racks and enclosures, raising operating temperatures of equipment and, in particular, equipment with high power consumption and/or equipment located in areas of an equipment room with thermal problems. Similarly, raised floor cooling systems and methods cannot account for local thermal problems where hot and warm exhaust air from one rack is drawn into adjacent and/or proximate racks causing equipment overheating. Raised floor cooling systems and methods cannot easily retrofit to existing cooling systems of an equipment room or data center or to existing equipment racks.

Air cooling systems and methods that require raised floor configurations also reduce available headroom in equipment rooms and data centers. Wires housed within air passageways below raised floors are difficult to access. In addition, such air passageways are difficult to clean. Open floor tiles and floor grills or vents also pose a safety risk to personnel. In addition, raised floor construction presents a risk of collapse during earthquake.

SUMMARY OF THE INVENTION

In general, in an aspect, the invention provides a system for exhausting air from an equipment enclosure and returning air to an air conditioner. The system includes an exhaust unit that couples to a back section of the equipment enclosure, the exhaust unit having at least one duct to direct air to a top portion of the exhaust unit. The system includes an exhaust duct that has a first end and a second end, the first end being constructed and arranged to couple to the top portion of the exhaust unit, and further includes at least one fan contained within either the exhaust unit or the exhaust duct to draw air from within the equipment enclosure and out through the exhaust unit and through the exhaust duct.

Implementations of the invention may include one or more of the following features. The exhaust unit forms a back door of the equipment enclosure, and is constructed and arranged to replace an existing back door of the equipment enclosure. The at least one fan includes a plurality of fans contained within the exhaust unit. The exhaust unit includes a corresponding duct for each fan of the plurality of fans, with a first corresponding duct having a minimum cross-sectional area approximately equal to a minimum cross-sectional area of a second corresponding duct. The exhaust duct is flexible, and wherein the second end of the exhaust duct is constructed and arranged to mate with a ceiling tile to allow exhaust air to be directed to an air plenum located above a ceiling.

The system further includes the equipment enclosure, and wherein the equipment enclosure includes an internal frame to allow mounting of equipment in an equipment area formed by the internal frame, a top panel, a bottom panel, a first side panel, a second side panel, and a front door having formed therein a number of openings to allow air drawn by the plurality of fans to by drawn through the openings, wherein the internal frame is coupled to the top panel, the first side panel and the second side panel to provide a substantially air tight seal so that substantially all air drawn through the openings in the front door passes through the equipment area and into the exhaust unit.

Implementations of the invention may further include one or more of the following features. The at least one fan is configured to operate at a variable speed. A controller is coupled to the at least one fan and constructed and arranged to control the variable speed of the fan. The controller controls the variable speed based on power drawn by equipment contained in the equipment enclosure. In addition, the controller controls the variable speed in response to a temperature of air in either the equipment enclosure or the exhaust unit. The system further comprises at least one user control to allow a user to control the variable speed of the at least one fan.

In addition, the system includes multiple power inputs and a circuitry module coupling the power inputs to the at least one fan. The circuitry module is configured to disconnect a first of the power inputs from the at least one fan and connect a second of the power inputs to the at least one fan in response to a loss of power at the first of the power inputs. The controller is constructed and arranged to sense opening of the back door of the equipment enclosure and to switch the at least one fan off when the back door is opened, and can be constructed and arranged to control the at least one fan to operate at maximum speed when the back door is opened. The controller is configured to detect a failure of one fan of the plurality of fans. The controller is further configured to communicate the failure to a device external to the equipment enclosure.

In another aspect, a method is provided for exhausting air from an equipment enclosure and returning air to an air conditioner, the equipment enclosure having a front door and a back door. The method includes receiving air through openings in the front door of the enclosure; drawing the air across equipment in the enclosure toward the back door of the enclosure; drawing the air toward an opening in the top of the back door and through an exhaust duct to a ceiling plenum; and returning the air to the air conditioner through the ceiling plenum; wherein drawing the air across the equipment and toward an opening in the top of the enclosure is accomplished using at least one fan mounted in either of the back door of the enclosure or the exhaust duct.

In still another aspect, a system is provided for exhausting air from an equipment enclosure and returning air to an air conditioner, the equipment enclosure having a front door and a back door. The system includes an exhaust duct that has a first end and a second end, the first end being constructed and arranged to couple to a top portion of the equipment enclosure. The system further includes means, contained within either the exhaust duct or the equipment enclosure, to draw air out of the equipment enclosure and through the exhaust duct.

In yet another aspect, an air exhaust system is provided for use with an enclosure containing equipment. The system includes a housing defining a chamber, an exhaust port in a top of the housing, and at least one intake port. The at least one intake port is configured to provide fluid communication between the chamber and a volume of air external to the housing. The housing is configured to couple to the enclosure such that the housing is adjacent to a first portion of the enclosure on a first side of the equipment from which the equipment vents air. The system includes at least one fan disposed within the chamber and coupled to the at least one intake port such that the fan is in fluid communication with the chamber and with the equipment. The fan is configured to draw air through the at least one intake port from the first side of the equipment such that the equipment contained in the enclosure draws air into a second portion of the enclosure on a second side of the equipment and vents air from the first side of the equipment. The at least one fan is further configured to force the drawn-in air into an exhaust duct provided by the housing, the exhaust duct being configured to channel fan-exhausted air from the fan to the exhaust port in a substantially parallel orientation to the first side of the equipment.

In a further aspect, an enclosure is provided including a frame configured to support the equipment in the enclosure, a door coupled to the frame, the door having at least one internal duct with an exhaust port, and means for drawing air across the equipment into the at least one internal duct and out the exhaust port.

In still a further aspect, a method is provided for cooling equipment contained in an enclosure, the equipment being configured and arranged in the enclosure to vent air into a first portion of the enclosure on a first side of the equipment, is provided. The method includes drawing air from a second portion of the enclosure on a second side of the equipment to the first portion of the enclosure; forcing the air into a duct provided by a housing; the housing coupled with the enclosure such that the duct and the first side of the equipment are in fluid communication; and guiding the air through the duct to a top of the housing; and venting the air from the top of the housing to an area external to the enclosure.

Various aspects of the invention may provide one or more of the following advantages. Heat can be removed from equipment, such as communications and information technology equipment, e.g., servers, CPUs, internetworking equipment and storage devices, housed in an equipment rack and/or enclosure that produces heat. Heat build-up and hot spots within a rack or enclosure, as well as overheating of equipment in a rack or enclosure, can be prevented by removing exhaust air produced by and vented from the equipment during operation. Internal temperatures of rack-mounted equipment and/or rack enclosures can be controlled.

An exhaust air removal system and method can be provided to remove exhaust air produced by rack-mounted equipment for efficient and effective cooling of the equipment. The system and method can be configured and arranged to help facilitate operation of rack-mounted equipment, e.g., drawing ambient air into the equipment and across equipment components to meet its cooling needs and venting hot and warm exhaust air. The system and method can provide heat removal redundancy, employing a fan unit having one or more fans coupled to a rack and/or enclosure housing equipment such that the fans draw and remove exhaust air vented from the equipment. The fan unit can contain the drawn-in exhaust air and can vent drawn-in air to an area external to the equipment.

By removing exhaust air from the equipment and the rack and/or enclosure, the fan unit can help to lower pressure and/or help to minimize/reduce backpressure at a vent side of the equipment, e.g., caused by air flow resistance, which can help to enable the equipment to draw ambient air into the enclosure sufficient to meet its cooling needs. In addition, the fan unit can help to minimize/reduce pressure differences between a vent side of equipment and an intake side of equipment to enable the equipment to operate effectively. The system and method employing the fan unit, therefore, can rely on cool ambient air supplied to an equipment room or data center in a range of from about 60 .degree. F. to about 70 .degree. F. to meet equipment cooling requirements.

The fan unit can draw exhaust air vented from rack-mounted equipment and can contain and vent exhaust air to an area external to the rack, e.g., an external exhaust duct or plenum connected to the fan unit. The fan unit can thereby help to eliminate or to at least minimize/reduce the extent to which exhaust air mixes with ambient air of an equipment room or data center. The fan unit can help to eliminate or to at least minimize/reduce undesirable recirculation of exhaust air to equipment. By helping to eliminate or to at least minimize/reduce mixing of exhaust air with ambient air and recirculating exhaust air to equipment, the fan unit can help to prevent or to minimize/reduce a thermal gradient of inlet temperatures of ambient air drawn into equipment from an intake side of equipment. Temperatures of ambient air drawn into equipment at a top portion of a rack thereby are not substantially higher/lower than temperatures of ambient air drawn into equipment at a bottom portion of the rack.

By removing and containing exhaust air, the fan unit can help to maintain ambient air temperature, e.g., within a range of from about 60 .degree. F. to about 70 .degree. F., and to enable rack-mounted equipment to rely on ambient air to meet its cooling requirements. Cooling and supplying ambient air within this range can help to eliminate or to at least minimize/reduce condensation and humidification problems typically associated with supplying cooling air at relatively low temperatures, e.g., 55 .degree. F. In addition, cooling and supplying ambient air within this range can help to eliminate or to at least minimize/reduce condensation and humidification problems and costs typically associated with supplying cooling air at relatively low temperatures, e.g., 55 .degree. F.

Without a need for cooling air at low temperatures, the system and method employing the fan unit can avoid a double or raised floor construction that can be used to provide cooling air at relatively low temperatures, e.g., 55 .degree. F., and to supply air directly into equipment racks and enclosures. The system and method, thus, can avoid the cost disadvantages associated with the operation and maintenance of raised floor cooling systems and methods. In addition, the system and method employing the fan unit can avoid the costs of reconfiguring equipment rooms and retrofitting cooling equipment and racks that may be required with raised floor cooling systems and methods.

Removing exhaust air vented by rack-mounted equipment with the fan unit can provide flexibility to accommodate a wide variation in electrical power drawn by rack-mounted equipment and a consequent wide variation in exhaust air produced by the equipment. The fan unit can be quickly and easily installed to and detached from an individual equipment rack and/or enclosure, as well as installed to and detached from an external exhaust duct, e.g., a duct coupled to the fan unit to vent exhaust air to a dropped ceiling exhaust plenum for removal of exhaust air from an equipment room or data center.

Control of fan-speeds can help to eliminate or to at least minimize/reduce a potential for rack-mounted equipment to draw ambient air at a flow rate greater or less than required to meet its cooling needs. A risk of rack-mounted equipment receiving too much or too little ambient air for cooling, therefore, can be eliminated or at least minimized/reduced. Control of fan-speeds can also help to avoid or to at least minimize/reduce a risk of returning exhaust air to an air conditioning or cooling system at a rate that can exceed or overcome a capacity of the air conditioning or cooling system. Fan-speeds can be controlled and adjusted in accord with measured values of a power load of equipment, and/or detected internal temperatures of equipment.

In addition, control of air flow and internal temperatures of rack-mounted equipment can be protected against power outages and power irregularities to prevent heat build up and overheating. Advantages of aspects of the invention can be provided to new or existing standard-dimensioned or non-standard-dimensioned racks and enclosures with minimal or no retrofitting of racks or enclosures.

These and other advantages of the invention, along with the invention itself, will be more fully understood after a review of the following figures, detailed description, and claims.

DETAILED DESCRIPTION OF PREFERRED EMBODIMENTS

Illustrative embodiments of the invention provide an exhaust air removal system and method for use with equipment rooms and data centers in which communications and information technology equipment is stored and operated. More particularly, an exhaust air removal system and method are provided to remove undesirable thermal exhaust air produced by equipment, such as rack-mounted servers, CPUs and other electronic equipment, during operation of the equipment. The exhaust air removal system is constructed and arranged to connect to an equipment rack and/or a rack enclosure. When connected to an equipment rack and/or enclosure, the system is disposed and configured to remove thermal exhaust air output from the rack by drawing and containing exhaust air vented from the rack and venting the exhaust air to an area external to the rack and/or the enclosure. The system is constructed and arranged to remove exhaust air vented by equipment in a rack and/or enclosure to help minimize or reduce resistance to air flow into the rack. Minimizing or reducing air flow resistance helps to enable the equipment in the rack to operate effectively, drawing sufficient air into the rack to meet its cooling requirements and venting exhaust air from the equipment and the rack.

The exhaust air removal system can be disposed and configured to vent thermal exhaust air to ambient air of an equipment room or data center in which a rack and/or enclosure is located. Alternatively, the system can be disposed and configured to vent thermal exhaust air to an external exhaust duct or system, e.g., an exhaust plenum disposed in a dropped ceiling of an equipment room or data center, to remove hot and warm air. In this context, the exhaust air removal system can be further configured to operate in conjunction with an air conditioning or cooling system that provides cool air to the equipment room or data center. The system can be operatively connected to the air conditioning or cooling system, whereby the system vents hot and warm air to the exhaust plenum, and the exhaust plenum is configured to guide or channel air to the air conditioning or cooling system. The air conditioning or cooling system cools exhaust air and supplies cool air to the equipment room or data center. Equipment in a rack and/or housed in an enclosure can draw cool air from ambient air space of the equipment room or data center into its components to cool itself during operation. Other embodiments are within the scope of the invention.

Figure 2:
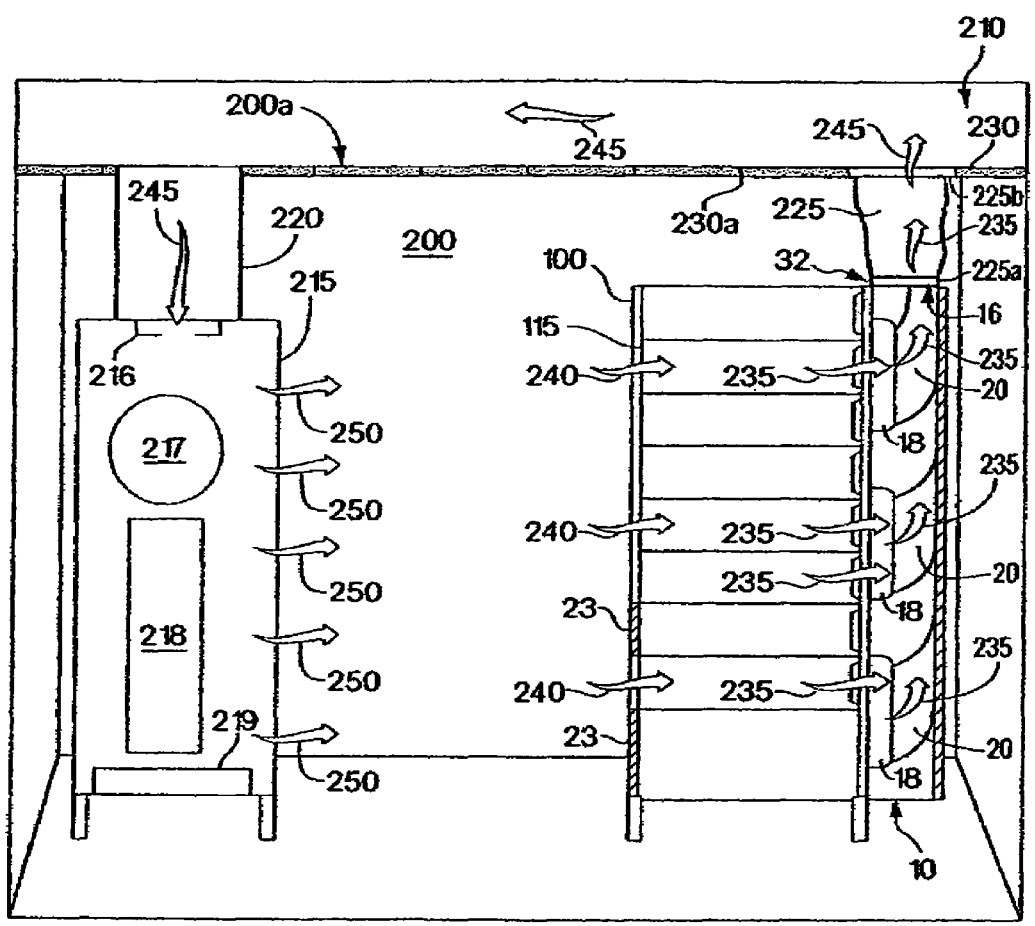
FIG. 2 is a side view of one embodiment of an exhaust system for an equipment room according to the present invention.

Referring to FIG. 2, in one embodiment, the invention provides an exhaust system for use in an equipment room or data center 200 having an enclosure 100 that houses an equipment rack 115. The system includes a self-contained exhaust air fan unit 10 coupled to the equipment enclosure 100, an exhaust plenum 210 disposed in an overhead dropped ceiling 200a of the equipment room 200 and coupled to the fan unit 10, and an air cooling system 215 coupled to the plenum 210 by an intake duct 220.

The fan unit 10 is connected or mounted, e.g., with connectors, screws and/or hinged devices, to the enclosure 100. The rack 115 includes rack-mounted equipment, e.g., servers, CPUs and other electronic components, arranged vertically on mounting rails within the rack 115. The fan unit 10 is preferably connected to a portion of the enclosure 100 from which the rack-mounted servers, CPUs and other components vent thermal exhaust air to an area external to the rack 115.

The fan unit 10 includes multiple fans 18, each fan 18 being coupled to an interior exhaust duct 20. The ducts 20 are configured and arranged to extend upward to a top 32 of the fan unit 10 and to terminate into an exhaust port 16. The exhaust port 16 is coupled to the plenum 210 by a duct 225. The duct 225 places the ducts 20 in the fan unit 10 in fluid communication with the plenum 210. A first terminal end 225a of the duct 225 is configured to couple to the exhaust port 16 of the fan unit 10 and a second terminal end 225b is configured to couple to the plenum 210.

The first terminal end 225a of the duct 225 can be preferably configured and arranged to removably connect the duct 225 to a perimeter that defines the exhaust port 16 of the fan unit 10. The second terminal end 225b of the duct 225 can be preferably configured and arranged to removably connect the duct 225 to the ceiling 200a. In particular, the second terminal end 225b can be preferably configured and arranged to removably connect to a ceiling tile 230 of the dropped ceiling 200a. Alternatively, the second terminal end 225b of the duct 225 can be connected to the ceiling tile 230, and the ceiling tile 230 can be configured and sized to removably mount within an overhead ceiling grid 230a that supports the dropped ceiling 200a. The removable ceiling tile 230 permits the duct 225 to removably connect to the plenum 210 such that the duct 225 and the fan unit 10 can be readily connected to and detached from the plenum 210.

The duct 225 can include other configurations whereby the duct 225 extends upward away from the fan unit 10 to an area below the ceiling 200a and/or the plenum 210. The second terminal end 225b of the duct 225 can align with one or more openings in the ceiling 200a, the ceiling tile 230 or a portion of the plenum 210 to permit the fan unit 10 to exhaust air from the exhaust port 16 through the one or more openings into the plenum 210.

As shown in FIG. 2, the plenum 210 is disposed and configured in the dropped ceiling 200a to receive exhaust air from the fan unit 10. The plenum 210 is further disposed and configured to guide or channel exhaust air to the intake duct 220. The intake duct 220 is disposed and configured to receive exhaust air from the plenum 210 and to guide or channel exhaust air into the air cooling system 215. The cooling system 215 cools exhaust air received from the intake duct 220 to a temperature within a desired range of temperature(s) and forces cool air into the equipment room 200, as shown by arrows 250 in FIG. 2.

The cooling system 215 includes a room-sized air conditioner unit having an inlet 216 configured to permit air from the plenum 210 to flow into the unit 215, a cooling assembly 217, e.g., including one or more cooling coils, to cool air received from the inlet 216, an exhaust assembly 218 to vent cool air from the unit 215 to the equipment room 200, and a condensate system 219 coupled to the system 215 to collect and to remove water condensate produced during operation.

Figure 2A:
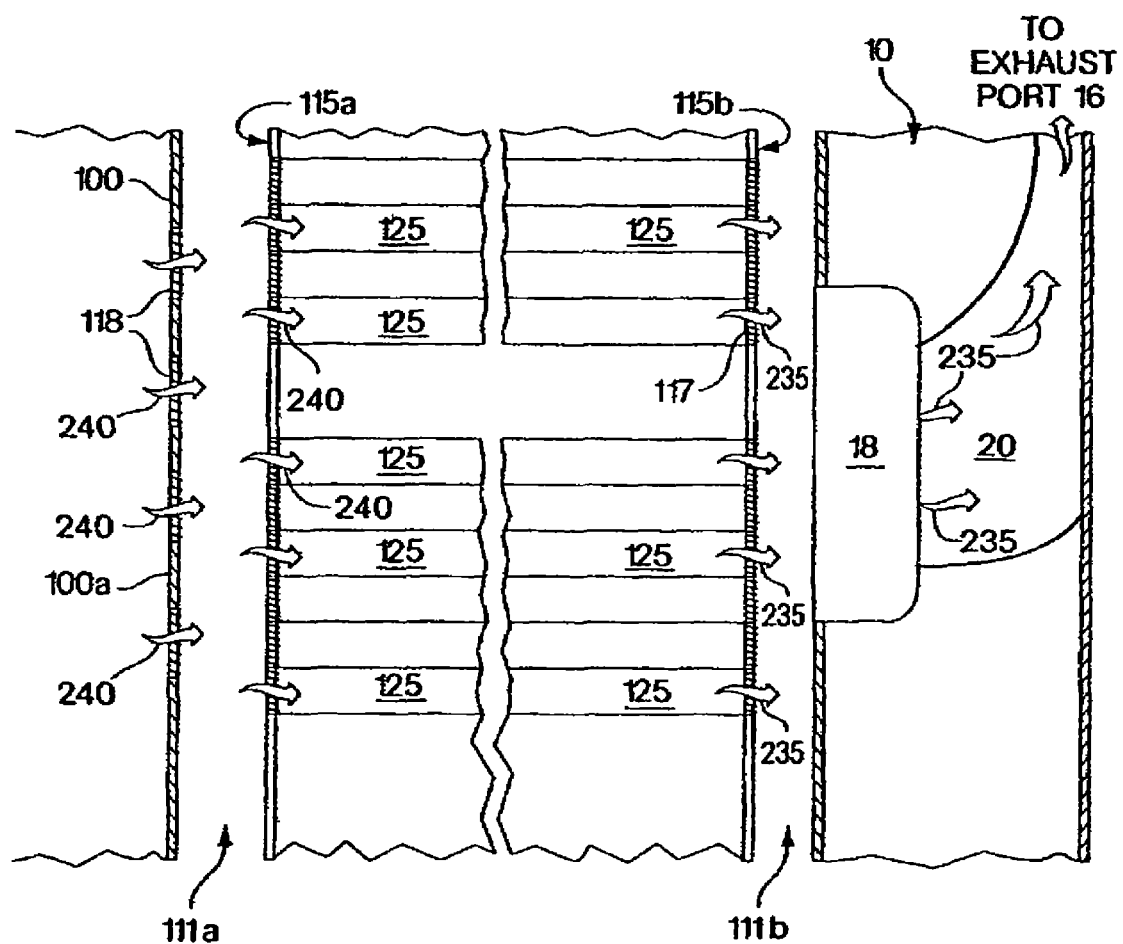
FIG. 2A is a side view of a portion of a fan unit of the exhaust system shown in FIG. 2 coupled to an equipment enclosure.

Referring also to FIG. 2A, the system is configured and arranged such that when the fan unit 10 is connected and/or mounted to the rack 115 and/or the enclosure 100 removal of exhaust air by the fan unit 10 helps to enable rack-mounted equipment 125 to operate effectively to meet its cooling requirements during operation by drawing cool air from ambient air space of the equipment room 200. Cool air is supplied to the equipment room from the air cooling system 215 and circulates in the equipment room 200. The equipment 125 in the rack 115 draws cool air, e.g., via fans in the equipment 125, from ambient air space into the enclosure 100 through inlet vents 118 provided by the enclosure 100. The inlet vents 118 are disposed in a front panel or door 100a of the enclosure 100 and are configured to permit air flow to an inlet area 11a. The inlet area 111a is air space defined between the front door 100a of the enclosure 100 and an air inlet side 115a of the rack 115. The fans in the equipment 125 draw ambient air through the inlet vents 118 and through the inlet area 111a into the equipment 125 along the inlet side 115a of the rack 115, as shown by arrows 240 in FIGS. 2-2A. The fans of the equipment 125 further draw air through its components and vent exhaust air through exhaust ports 117 of the equipment 125. The exhaust ports 117 are disposed and configured to vent exhaust air from a vent side 115a of the rack 115 to an exhaust area 111b. The exhaust area 111b is air space defined by the vent side 115a of the rack 115 and the fan unit 10. The fans 18 of the fan unit 10 are disposed and configured to draw exhaust air from the exhaust area 111b and the exhaust ports 117 into the fans 18, and to force drawn-in exhaust air into the ducts 20, as shown by arrows 235 in FIGS. 2-2A. The ducts 10 are configured to exhaust air and to guide exhaust air to the exhaust port 16. The exhaust port 16 vents exhaust air to an area external to the enclosure 100.

Removal of exhaust air from the exhaust area 111b by the fans 18 helps to lower pressure in the exhaust area 111b and/or helps to prevent or to at least minimize backpressure in the exhaust area 111b. Backpressure can be caused by, for instance, resistance to a flow of fan-exhausted air through the ducts 20 due to the configuration, e.g., curvature, of the ducts 20. In addition, bundles of wires typically located in a back of the rack 115, e.g., adjacent to the vent side 115b of the rack 115, can cause resistance to air flow that increases pressure in the exhaust area 111b. A lower pressure in the exhaust area 111b reduces air flow resistance that the fans in the equipment 125 must overcome to vent exhaust air from the rack 115. A lower pressure in the exhaust area 111b also helps to compensate for low pressure, e.g., below ambient pressure, at the inlet side 115a of the rack 115. Low pressure at the inlet vents 118 and in the inlet area 111a is caused when the fans in the equipment 125 operate to overcome air flow resistance, e.g., of the inlet vents 118, and thereby lower pressure at the inlet vents 118 and in the inlet area 111a. When low pressure exists in the inlet area 111a and high pressure exists in the exhaust area 111b, the fans in the equipment 125 cannot provide sufficient air flow through the equipment 125. The fans 18 of the fan unit 10 help to remove exhaust air from the exhaust area 111b to thereby help to minimize or reduce pressure differences between the inlet area 111a and the exhaust area 111b. Minimizing and reducing pressure differences helps the fans in the equipment 117 to operate effectively as if pressure differences were not present and to draw sufficient cool air through the equipment 125 to meet the equipment 125 cooling requirements, as shown by arrows 240 in FIGS. 2-2A.

The fans 18 force drawn-in air into the ducts 20, and the ducts 20 channel and vent fan-exhausted air to the exhaust port 16, as shown by arrows 235 in FIGS. 2-2A. The exhaust port 16 vents exhaust air into the duct 225 and the duct 225 channels exhaust air into the plenum 210. The plenum 210 returns exhaust air to the air cooling system 215 through the intake duct 220, as shown by arrows 245 in FIGS. 2-2A. Exhaust air is cooled by the air cooling system 215 to a temperature within a desired range of temperature(s) and then is forced to ambient air space of the equipment room 200.

Figure 3A:
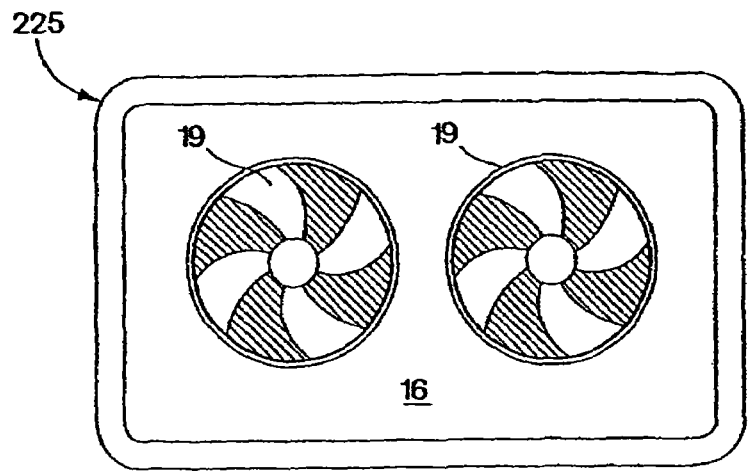
FIG. 3A is a top view of an exhaust port of an optional exhaust air fan unit that can be used with the embodiment shown in FIG. 2.
Figure 3B:
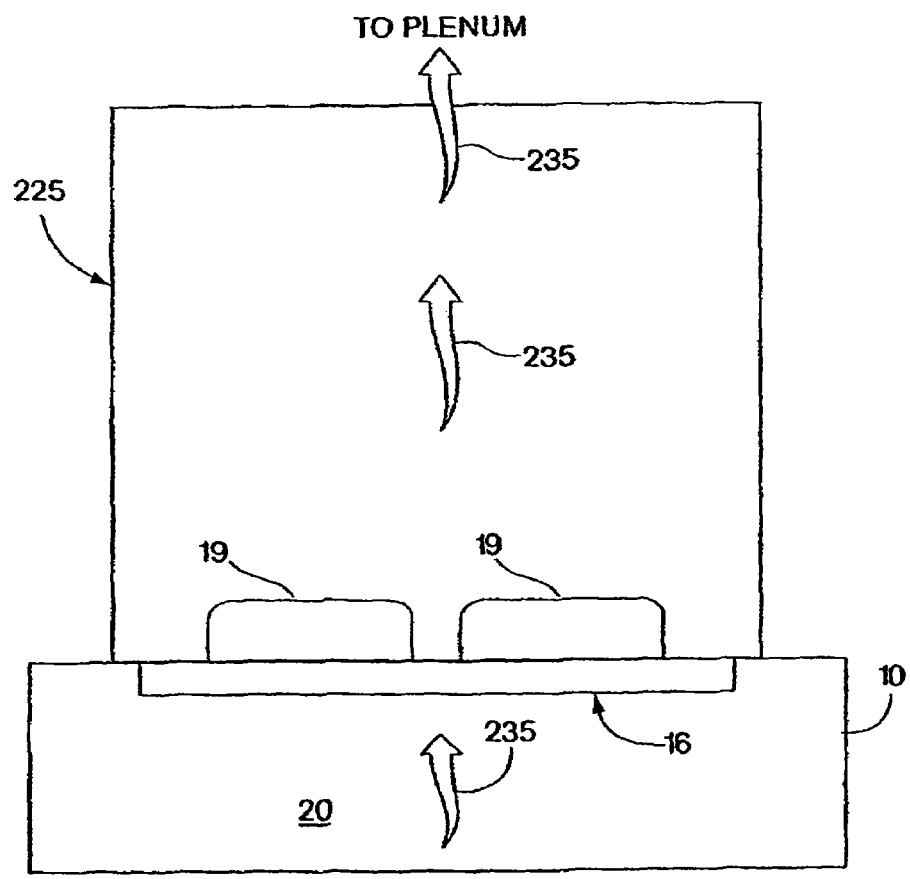
FIG. 3B is a side view of the exhaust port of the fan unit shown in FIG. 3A connected to an exhaust duct.

Referring to FIGS. 3A-3B, alternatively or in addition to the multiple fans 18 of the fan unit 10, one or more fans 19 can be disposed in the duct 225. As shown in FIG. 3B, the fans 19 can be configured and connected to the duct 225 such that the fans 19 are disposed over an area defined by the exhaust port 16. The fans 19 operate to draw in exhaust air from the ducts 20 and to force the drawn-in air into the duct 225 and into the plenum 210, as shown by arrows 235 in FIG. 3B. In the alternative, the fans 19 can be disposed in the duct 225 to draw in exhaust air from a single duct 20 of the fan unit 10.

As shown in FIGS. 2-2A, the exhaust system, including the fan unit 10 connected or mounted to the enclosure 100, the ceiling plenum 210 and the air cooling system 100 relies, on the equipment 125 in the rack 115, e.g., fans disposed in equipment components, to draw sufficient cool air from ambient air space into the equipment 125 to meet the cooling requirements of the rack 115. By containing and removing exhaust air from the enclosure 100 and minimizing or reducing pressure differences between the inlet side 115a and the vent side 115b of the rack 115, the fan unit 10 helps to mitigate the effects of air flow resistance and helps to facilitate the equipment's 116 ability to operate effectively, e.g., without drawing air from low pressures areas. Operating effectively the equipment 125 draws sufficient cool air into the rack 115 to cool the equipment 125 and vents sufficient exhaust air to help prevent overheating and hot spots. The system shown in FIGS. 2-2A, therefore, does not require the raised floor 5 construction of the closed air circulation system shown in FIG. 1, which is required to force sufficient cool air directly into the equipment enclosure 8 to meet equipment cooling requirements. Rather, the fan unit 10 enables the equipment 125 in the rack 115 to operate effectively to meet its cooling requirements by relying on cool ambient air.

The fan unit 10 is constructed and arranged to substantially contain exhaust air vented from the equipment 125. When the fans 18 drawn-in exhaust air and the ducts 20 channel fan-exhausted air to the exhaust port 16, the fan unit 10 permits little or substantially no exhaust air, e.g., allows less than about ten percent (10%) or only a small or insubstantial volume of air, to leak from between the enclosure 100 and the fan unit 10 to an area external to the fan unit 10.

In one embodiment, one or more panels 23 connected or mounted to one or more unused portions of the rack 115, in which no equipment is installed, helps to prevent or to at least reduce air flow through the unused portions of the rack 115. The panels 23 help to maintain air flow in a direction indicated by arrows 240 and 235 shown in FIGS. 2-2A. In addition, in some embodiments of the invention, any spaces between a frame of the rack 115 and top, bottom and side panels of the enclosure 100 are sealed to prevent air leakage from the enclosure 100 and/or the fan unit 10.

Figure 4:
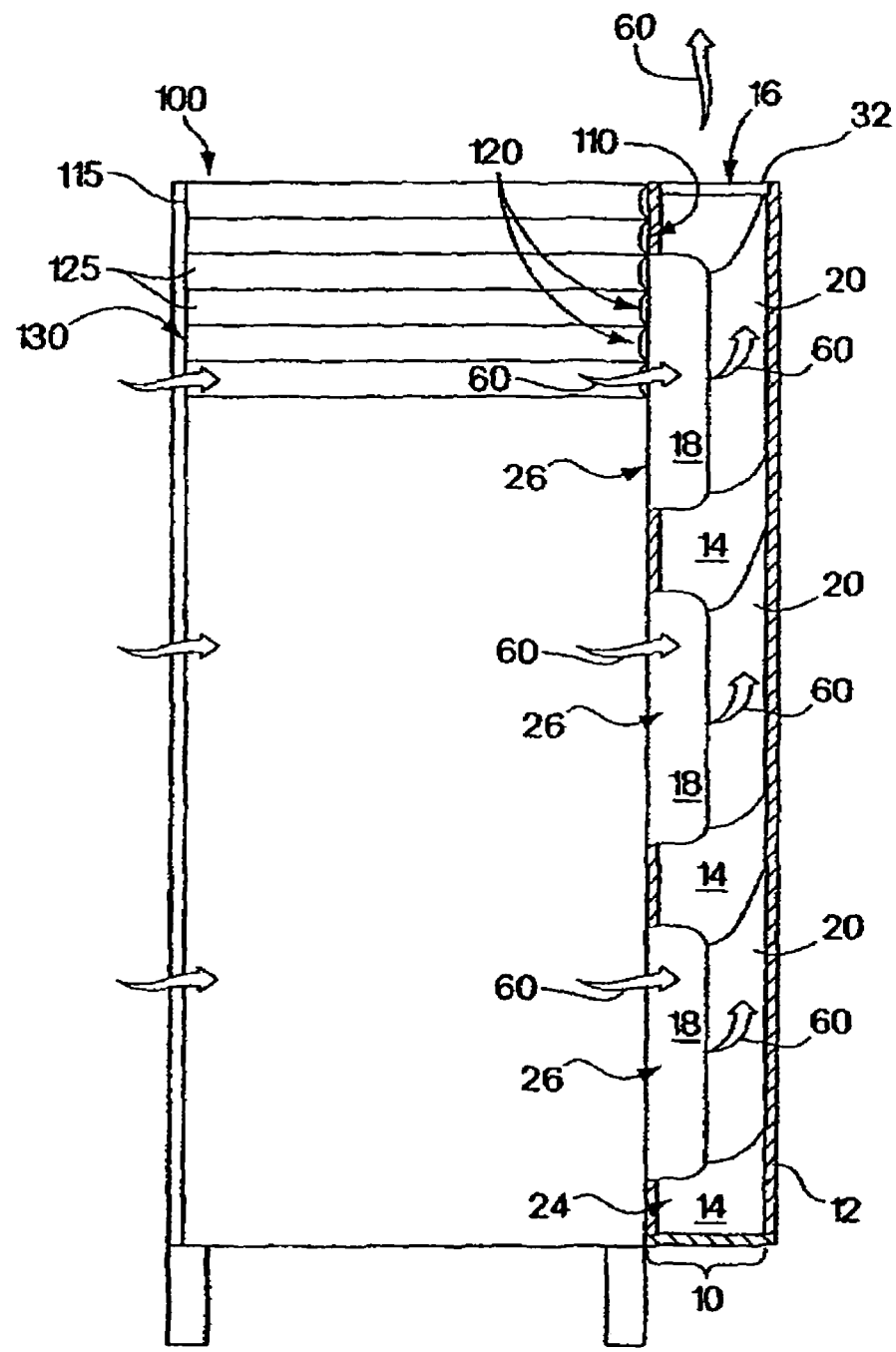
FIG. 4 is a side view of an exhaust air fan unit according to another embodiment of the present invention.

Referring to FIG. 4, the fan unit 10, as discussed above, includes a housing 12, multiple fans 18 disposed in the housing 12, an interior exhaust duct 20 provided by the housing 12 that extends from each fan 18 to an exhaust port 16 disposed in a top 32 of the housing 12, and fan speed control. The fan unit 10 further includes a dual power input (not shown) to supply power to the fan unit 10, and dual independent fusing (not shown) to protect operation of the fan unit 10 during power outages and power irregularities.

The housing 12 is configured and arranged to connect or mount the fan unit 10 to the enclosure 100, and preferably configured to be at least a part of a door of the enclosure 100. As shown in FIG. 4, the housing 12 is configured to connect or mount to the enclosure 100 such that the fan unit 10 is adjacent to the equipment 125, e.g., servers, CPUs and other electronic components, mounted in the rack 115 contained by the enclosure 100. The housing 12 is preferably connected to the enclosure 100 to face a side 115a of the equipment 125, e.g., a vent side of the servers, from which the equipment 125 vents exhaust air.

Figure 5A:
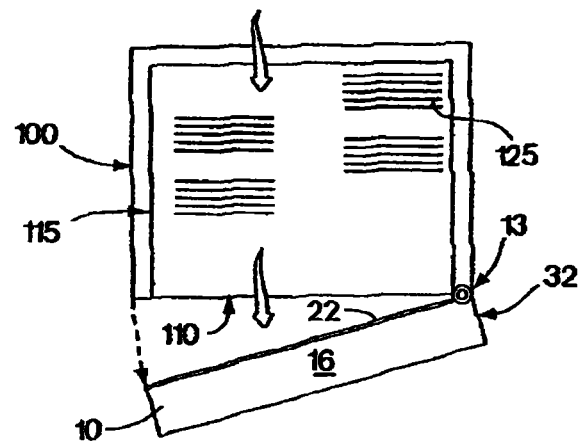
FIG. 5A is a top view of the fan unit shown in FIG. 4 partially removed away from an enclosure to which the fan unit is attached.
Figure 5B:
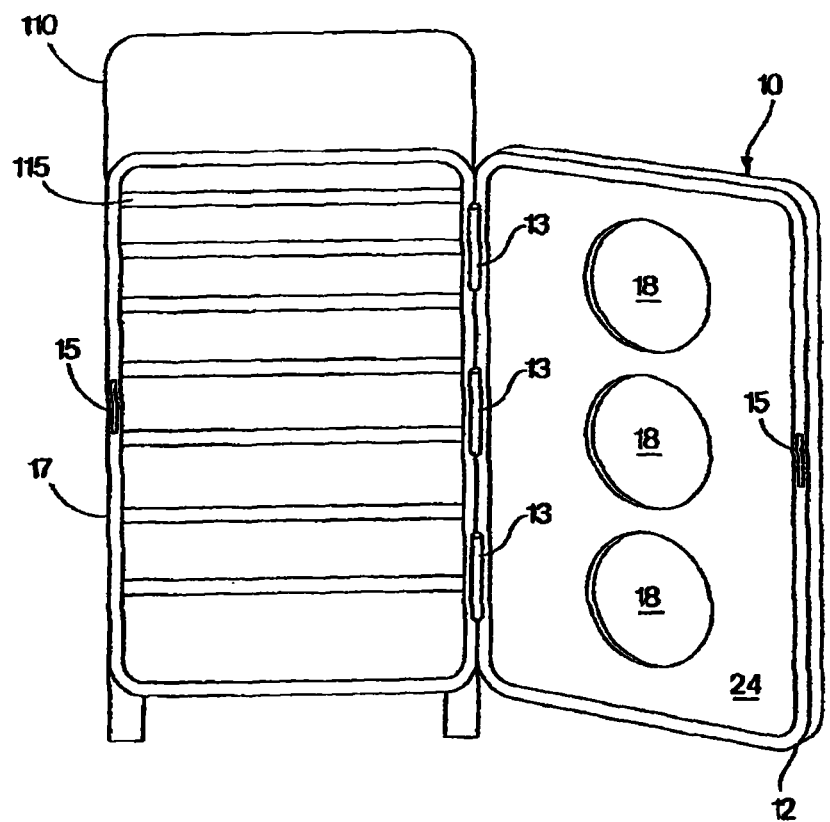
FIG. 5B is a back view of the enclosure shown in FIG. 5A and an inside view of the fan unit shown in FIGS. 4 and 5A.

Referring also to FIGS. 5A-5B, the housing 12 is preferably connected or mounted to the enclosure 100 with connectors 13, e.g., one or more hinged devices, along one side of the housing 12 to pivotally connect or mount the housing 12 to the enclosure 100 such that the fan unit 10 serves as part of a door of the enclosure 100. The hinged devices 13 permit the housing 12 to open from a first side and to pivot at a second opposite side at which the hinged devices 13 are connected to the enclosure 100 to help allow the fan unit 10 to open away from the enclosure 100 in a door-like manner and to provide access to the interior of the enclosure 100 and the servers 125 in the rack 115. Adjacent to the first side of the housing 12, the housing 12 provides a connector 15, e.g., a latch device, to mate with a corresponding connector 15 provided by the enclosure 100 or the rack 115 such that when the connectors 15 are coupled, the connectors 15 help to secure and to close the fan unit 10 to the enclosure 100.

As shown in FIG. 5A, an air seal 22 is disposed adjacent to a perimeter edge of the housing 12. The air seal 22 couples with the enclosure 100 when the fan unit 10 is connected or mounted to the enclosure 100. The air seal 22 helps to create a seal that is substantially air-tight, e.g., allows less than about ten percent (10%) or only a small or insubstantial volume of air to leak from between the enclosure 100 and the fan unit 10 to an area external to the enclosure 100 when the enclosure and the fan unit 10 are coupled and the fan unit 10 operates. The air seal 22 helps the fan unit 10 to increase and/or to optimize a rate of air flow into a front side 130 of the rack 115, across the servers 125 and to and from the back side 110 of the rack 115. The air seal 22, thus, helps to increase a rate at which the fan unit 10 removes hot and warm exhaust air from the server 125 and the enclosure 100 interiors and exhausts the air from the housing 12.

The housing 12 is preferably configured to connect and to fit to a new or existing standard-dimensioned equipment rack and/or rack enclosure. The housing 12 is preferably configured and arranged such that the fan unit 10 can replace an existing panel or door of the rack 115 and/or the enclosure 100 from which exhaust air is vented with minimal or no retrofitting of either the fan unit 10, the rack 115 or the enclosure 100. In addition, a preferred configuration of the housing 12 permits the fan unit 10 to be removed from or connected to the rack 115 and/or the enclosure 100 as needed in response to different cooling requirements, e.g., when equipment is replaced or rearranged within the rack 115 and/or the enclosure 100 and the thermal exhaust air output of the rack 115 and/or the enclosure 100 changes. A preferred configuration of the housing 12, therefore, permits the fan unit 10 to readily connect or mount to a newly installed or existing rack and/or enclosure having standard dimensions. For example, the housing 12 can have a depth of about 5 inches, a height of about 72 inches and a width of from about 19 inches to about 23 inches to permit the fan unit 10 to connect or mount to a standard-dimensioned rack or rack enclosure. To facilitate connection and fit of the fan unit 10 to a non-standard-dimensioned rack and/or enclosure, the housing 12 can be configured and arranged to connect or mount to an interface unit or panel 17. The interface panel 17 can include dimensions that permit the fan unit 10 to connect or mount to the interface panel 17 such that the interface panel 17 retrofits the fan unit 10 to the nonstandard-dimensioned rack 115 and/or enclosure 100.

Figure 6:
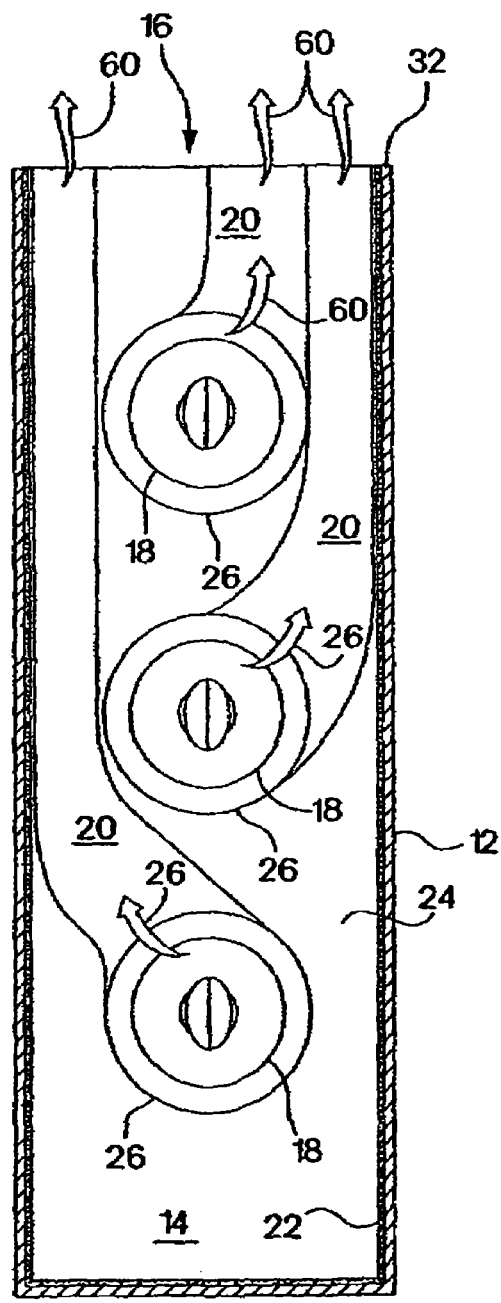
FIG. 6 is an interior view of multiple ducts and fans of the fan unit shown in FIG. 4 and FIGS. 5A-5B.

Referring to FIGS. 4 and 6, the housing 12 defines an interior chamber 14 and the exhaust port 16 disposed in the top 32 of the housing 12. The fans 18 are disposed in the chamber 14 adjacent to the back side 110 of the rack 115 when the housing 12 is attached to the enclosure 100. A side panel 24 of the housing 12 defines ports 26 over which the fans 18 are disposed such that the fans 18 are in fluid communication with the rack 115 and with the interior of the enclosure 100. Each port 26 is configured such that each fan 18 couples or mates with its port 26 and is disposed in its respective internal exhaust duct 20 to place the rack 115 in fluid communication with the internal exhaust ducts 20. Each internal exhaust duct 20 is disposed in the chamber 14 and configured to extend upward away from each fan 18 through the chamber 14 to the exhaust port 16.

Figure 7:
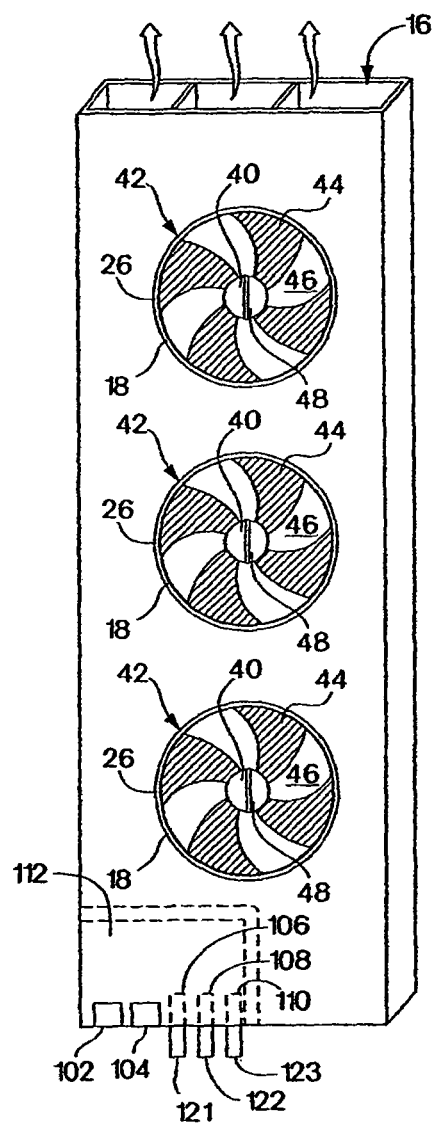
FIG. 7 is an opposing perspective view of the fans shown in FIG. 6 and of fail-over circuitry.

Referring also to FIG. 7, the fans 18 are configured for inducing radially outward air flow from the fans 18. The fans 18 are further configured to draw and to receive air through the ports 26. The fans 18 are configured to rotate about hubs 48 that include internal motors (not shown), fixed top portions 38 and rotating lower portions 40 that can rotate relative to the top portions 38. The fans 18 may include, but are not limited to, fans with motorized impellers, e.g., backward curved impellers, or axial type fans, such as those manufactured by EBM Industries, Inc. of Farmington, Conn. (although numerous other fans including fans made by other manufacturers are acceptable and can be used as the fans 18).

Rings 42 of blades or fins 44 are angled relative to a radial direction of the fans 18 such that rotation of the rings 42 by the motors will draw air through the ports 26 into internal regions 46 of the fans 18 that are in fluid communication with the rack 115. The rotation of the fans 18 will force drawn-in air from the internal regions 46 of the fans 18 radially outward into the ducts 20, as indicated by arrows 60 shown in FIG. 4. Preferably, the rings 42 are configured such that the internal regions 46 span areas at least as large as areas spanned by the ports 26 such that air will flow only (or substantially only) into the fans 18 through the ports 26.

The fans 18 and the ducts 20 are configured to help remove hot and warm air from the interior of the servers 125 and the enclosure 100 to help to control and to maintain a substantially constant interior temperature, e.g., .+−.2 .degree. F. of a desired temperature, of the servers 125 and the enclosure 100. Each duct 20 is configured to guide or channel fan-exhausted air upward, away from the fan 18 and toward the exhaust port 16 from which the air is expelled from the housing 12, as shown by arrows 60 in FIGS. 4 and 6.

The ducts 20 are configured and arranged in the chamber 14 as separate ducts with one duct 20 dedicated to one fan 18. Each duct 20 is configured with a minimum cross-section about equal to a minimum cross-section of other ducts 20 in the chamber 14. Each fan 18 and its duct 20 are configured and arranged such that fan-exhausted air does not impede or fight against fan-exhausted air removed by other fans 18 and guided upward by other ducts 20. The ducts 20 are further configured such that each duct 20 about equally impedes fan-exhausted air as each of the other ducts 20. The fans 18 and the ducts 20 are configured and arranged such that each fan 18 removes and exhausts air into its duct 20 at approximately the same rate.

Each fan 18 is configured and disposed in the housing 12 to draw air vented from about twenty (20) to about thirty (30) servers 125. A typical rack can mount a minimum of about ten (10) servers up to a maximum of about forty (40) servers 125. Pairs of fans, therefore, can draw exhaust air from some of the same servers 125.

The fans 18 have a flow capacity to provide an air flow rate, e.g., cubic feet per minute (cfm) of air, sufficient to draw exhaust air and to force exhaust air from the housing 12 to accommodate the thermal exhaust air output of the servers 125. For example, each of the three fans 18 can have a flow capacity of about 500 cfm to vent the exhaust air output of about forty (40) servers 125 in the rack 115. With each of the servers 125 capable of an output of from about 8 to about 25 cfm of exhaust air, the fans 18 can draw and force exhaust air from the rack 115 at a rate of at least about 320 cfm to about 1,000 cfm to help accommodate the thermal exhaust air output of the forty (40) servers 125. In other configurations and arrangements of the rack 115 and/or the enclosure 100 wherein more or less equipment components are in the rack 115 and more or less thermal exhaust air is vented from the components, the number and the capacity of the fans 18 included in the fan unit 10 can be increased and/or decreased to accommodate different thermal outputs of the rack 115. The configuration and arrangement of the fan unit 10 permits more fans 18 in the housing 12, having a lower flow capacity than 500 cfm, as well as permits fewer fans 18, having a higher flow capacity than 500 cfm, to accommodate the thermal exhaust air output of the rack 115.

The fans 18 have variable speeds to affect an air flow rate. For example, the fans 18 can have multiple, fixed-step speeds, or substantially infinitely variable speeds. The operating speed of the fans 18 can be adjusted in response to speed-control signals received at respective inputs. As described in further detail below, speed-control signals can be provided to the fans 18 to set and to adjust fan speed, and thereby to control an air flow rate produced by the fans 18 in response to detection and/or measurement of one or more operation variables of equipment in the rack 115 or, for instance, of one or more environmental conditions of the rack 115, the enclosure 100, and/or an equipment room in which the enclosure 100 is located.

Figure 8:
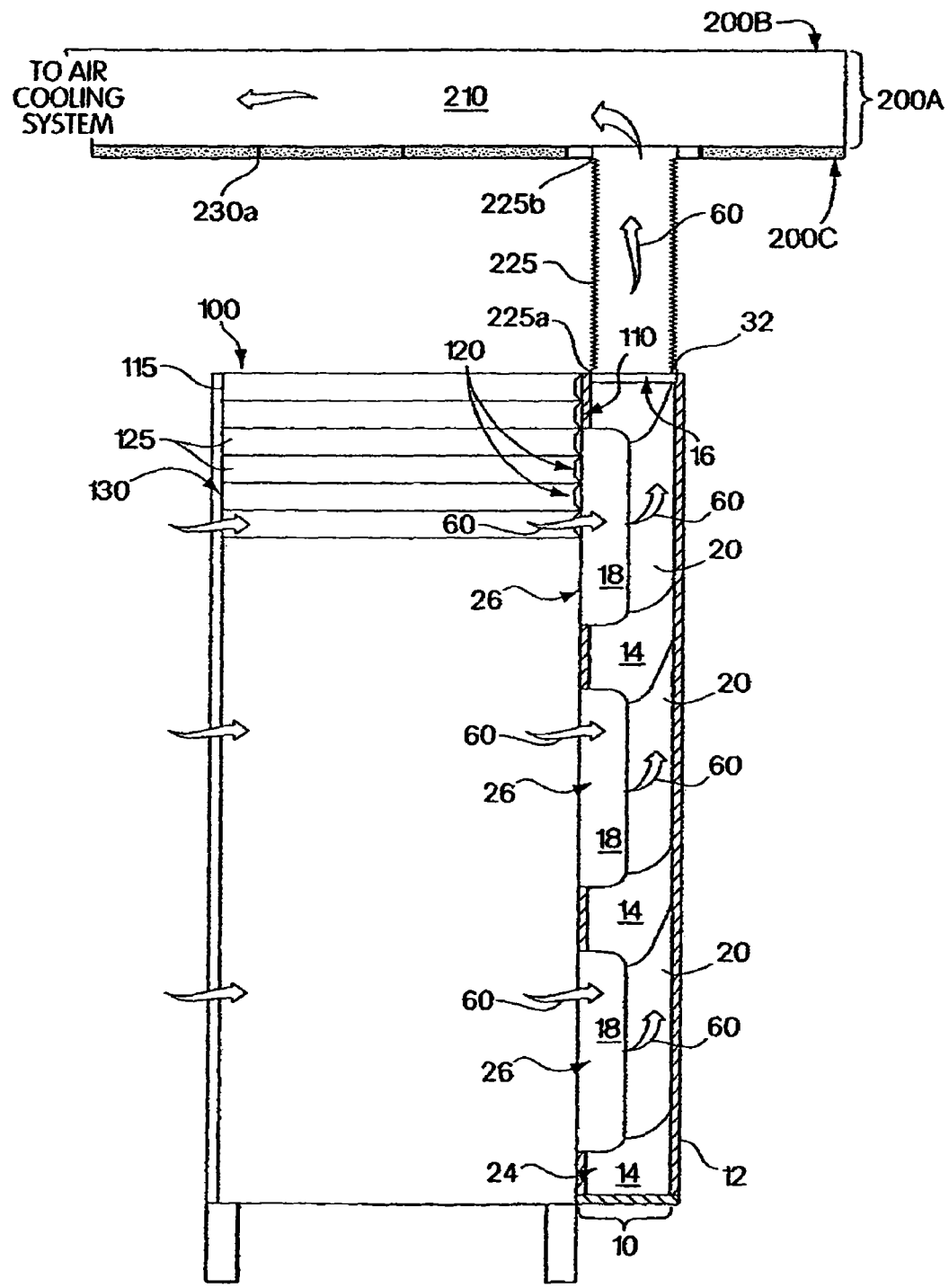
FIG. 8 is a side view of the fan unit shown in FIG. 4 connected to a duct and a ceiling plenum.

The exhaust port 16 is configured to vent fan-exhausted air from the ducts 20 directly to ambient air of an equipment room in which the enclosure 100 is located. Alternatively, referring to FIG. 8, the exhaust port 16 can be configured for connection to an external overhead exhaust plenum 210, e.g., suspended from a ceiling of an equipment room or provided by an overhead dropped ceiling 200a of an equipment room in which the enclosure 100 is located. The exhaust port 16 vents fan-exhausted air into the plenum 210 for removal of exhaust air from the equipment room, or at least from an area immediately surrounding an exterior of the enclosure. The plenum 210 can be defined between an upper portion 200b and a lower portion 200c of the dropped ceiling 200a. The exhaust port 16 can be configured and arranged to connect to the ceiling 200a and thereby to the plenum 210.

Figure 9A:
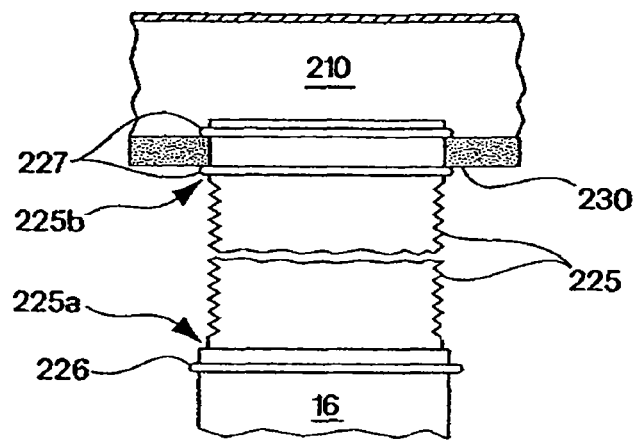
FIG. 9A is a side view of the duct shown in FIG. 8.

Referring also to FIG. 9A, the exhaust port 16 can be further configured and arranged to connect to a duct 225. The duct 225 is configured for connection to the ceiling 200a such that, when the duct 225 is connected to the exhaust port 16 and to the ceiling 200a, the exhaust port 16, the duct 225 and the plenum 210 are in fluid communication. A first terminal end 225a of the duct 225 is configured to couple to the exhaust port 16, and a second terminal end 225b is configured to couple to the ceiling 200a. The first terminal end 225a can be configured, e.g., with quick-fit type connectors or fasteners, to removably connect the duct 225 to the exhaust port 16, and the second terminal end 225b can be configured, e.g., with quick-fit type connectors or fasteners, to removably connect the duct 225 to the ceiling 200a such that the duct 225 can be readily connected to and disconnected from the exhaust port 16 and the ceiling 200a. The first terminal end 225a of the duct 225 having quick-fit type connectors or fasteners permits the fan unit 10 to disconnect from the duct 225 and to open away from the enclosure 100 in a door-like manner for providing access to the interior of the enclosure 100 and to the equipment in the rack 115, even during operation of the fan unit 10.

In addition, the second terminal end 225b of the duct 225 can be further configured and arranged such that the duct 225 is removably connected to a ceiling tile 230 of the dropped ceiling 200a. The ceiling tile 230 can be configured and sized to removably mount within an overhead ceiling grid that supports the dropped ceiling 200a. The ceiling tile 230 permits the duct 225 to be removably connected to the plenum 210. To connect or disconnect the duct 225 to the plenum 210, the ceiling tile 230 can be mounted to or removed from the ceiling grid 230a. The removable connection of the ceiling tile 230 to the ceiling grid 230a and, hence, the removable connection of the fan unit 10 to the plenum 210 permits the fan unit 10 to be readily connected to and disconnected from the plenum 210 without removing the duct 225 from the fan unit 10. The fan unit 10 can be rearranged with the enclosure 100 to which it is connected in an equipment room without detachment of the fan unit 10 from the enclosure 100. The ceiling tile 230 is simply removed from the ceiling grid 230a for detachment of the fan unit 10 and the enclosure 100. In addition, the fan unit 10 can be installed to another enclosure in the same or a different equipment room by inserting the ceiling tile 230 in the ceiling grid 230a.

The first terminal end 225a of the duct 225 can be configured and arranged to receive or to mate with one or more gaskets 226, e.g., O-ring type gaskets, to help achieve an air-tight seal between the duct 225 and the exhaust port 16 when the duct 225 is connected to the exhaust port 16. Alternatively, or additionally, an edge defining a perimeter of the exhaust port 16 can be configured and arranged to receive and/or to mate with the one or more gaskets 226 when the duct 225 and the exhaust port 16 are connected. Similarly, the second terminal end 225b of the duct 225 can be configured and arranged to receive and/or to mate with one or more gaskets 227, e.g., O-ring type gaskets, to help achieve an air-tight seal between the second terminal end 225b of the duct 225 and the plenum 210, the ceiling 200a or the ceiling tile 230 to which the duct 225 is connected. Alternatively, or additionally, either one of the plenum 210, the ceiling 200a or the ceiling tile 230 can include a port defined by an edge configured and arranged to receive and/or to mate with the one or more gaskets 227 to achieve an air-tight seal between the duct 225 and the plenum 210.

Figure 9B:
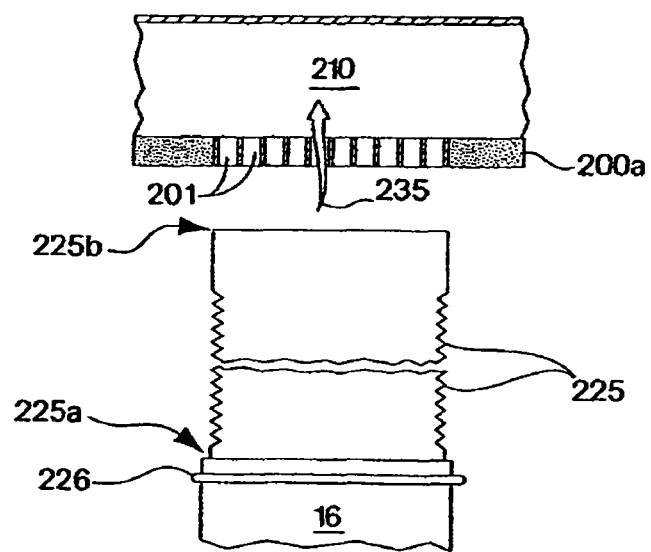
FIG. 9B is a side view of a duct aligned with a plurality of openings in a ceiling.

Alternatively, referring to FIG. 9B, the duct 225 can be configured and arranged to extend upward away from the exhaust port 16 toward the ceiling 200a when the duct 225 is coupled to the exhaust port 16 such that the second terminal end 225b of the duct 225 is below the ceiling 200a or the plenum 210 and the exhaust port 16 vents fan-exhausted air to the ceiling 200a or the plenum 210, as shown by arrow 235 in FIG. 9B. The second terminal end 225b of the duct 225 can be disposed such that an area defined by the second terminal end 225b is substantially aligned with one or more openings 201 defined in the ceiling 200a, e.g., a ceiling vent or grill, or, in other embodiments, aligned with one or more openings defined in the ceiling tile 230 or a bottom portion of the plenum 210. The duct 225 and the second terminal end 225b are thereby disposed to provide fluid communication between the exhaust port 16 and the plenum 210 and to guide or channel fan-exhausted air vented from the exhaust port 16 through the duct 225 and the openings 201 into the plenum 210.

Figure 9C:
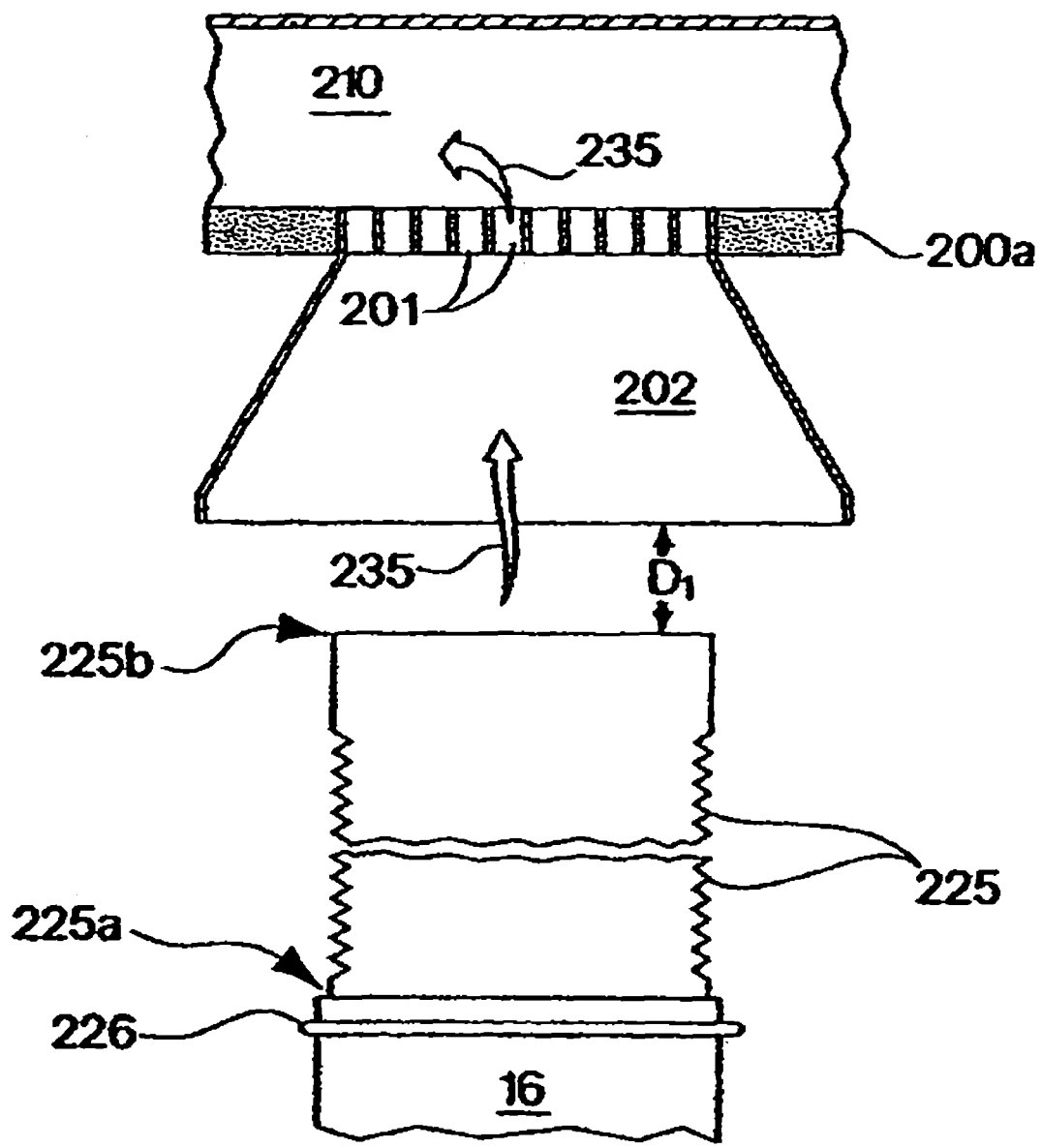
FIG. 9C is a side view of the duct shown in FIG. 9B aligned with a hood extending from a ceiling.

Referring to FIG. 9C, in the context in which the ceiling 200a includes one or more openings 201, a hood 202 can be connected to the ceiling 200a to surround the openings 201. The hood 202 can be disposed and configured to help receive and to help guide or channel air vented from the exhaust port 16 through the opening 201 and into the plenum 210. The hood 202 can be further configured such that it extends downward away from the ceiling 200a and defines an increasing diameter or width as it descends from the ceiling 200a. The hood 202 is not limited to a particular shape or configuration and can include other configurations than that shown in FIG. 9C to help permit the hood 202 to capture and to channel or guide a sufficient volume of exhaust air vented from the exhaust port 16 to help prevent build-up of exhaust air between the duct 225 and the opening 201. The hood 202 permits the fan unit 10 to vent exhaust air into the plenum 210 without the fan unit 10 being connected via the duct 225 to the ceiling 200a and thereby helps to facilitate portability of the fan unit 10. A distance $D_1$ between the ceiling 200a and the second terminal end 225b of the duct 225 can include, but is not limited to, a range of from about 1 inch to about 24 inches, e.g., depending upon conditions under which the fan unit 10 operates and a configuration of an equipment room.

In other embodiments in which the duct 225 is not connected to the ceiling 200a or the plenum 210, the duct 225 can vent exhaust air directly upward to ambient air above the enclosure 100 and the fan unit 10. For equipment rooms with high ceilings, e.g., 15 to 20 feet high, hot and warm exhaust air would remain above the enclosure 100 and the fan unit 10 when exhausted from the duct 225 to ambient air due to its buoyancy. Air conditioning return vents operatively coupled to an air conditioning or cooling system, e.g., a comfort air conditioning system that provides cool air to an equipment room and/or to other areas of a building, can return exhaust air vented from the fan unit 10 to the air conditioning system for cooling. In this context, an air cooling system 215, as shown in FIG. 2, may not be required.

The duct 225 is constructed of material suitable for permitting quick and easy connection and disconnection of the duct 225 to the plenum 210. Suitable material can be lightweight to provide ease in disconnecting and connecting the duct 225, e.g., by one operator, to the exhaust port 16 and the plenum 210, the ceiling 200a or the ceiling tile 230. In addition, suitable material can have flexibility to help facilitate connection and disconnection of the duct 225, particularly when the exhaust port 16 and the plenum 210, the ceiling 200a, or the ceiling tile 230 are not substantially aligned, or when distances between the exhaust port 16 and the plenum 210 vary substantially between different racks and/or enclosures with which the fan unit 10 is connected. Suitable materials include, but are not limited to, reinforced metal foil, reinforced plastic, plastic, metal, and combinations thereof.

In other embodiments in which the duct 225 is not connected to the ceiling 200a or the plenum 210, as described above, the duct 225 can be constructed of a material suitable for providing rigidity such that the duct 225 can channel or guide exhaust air substantially upward away from the fan unit 10 and the enclosure 100. Suitable materials include, but are not limited to, metals, e.g., aluminum or stainless steel, plastic laminates, plastic, and combinations thereof.

As described above, the duct 225 can connect via the plenum 210 to the air conditioning or cooling system 215, as shown in FIG. 2, which receives and cools fan-exhausted air. Temperatures of fan-exhausted air delivered by the plenum 210 to the air cooling system 215 can, in effect, help to increase or maximize an efficiency of the air cooling system 215 due to a temperature differential between fan-exhausted air and one or more cooling elements, e.g., cooling coils, comprising a cooling assembly of the air cooling system 215.

Figure 10:
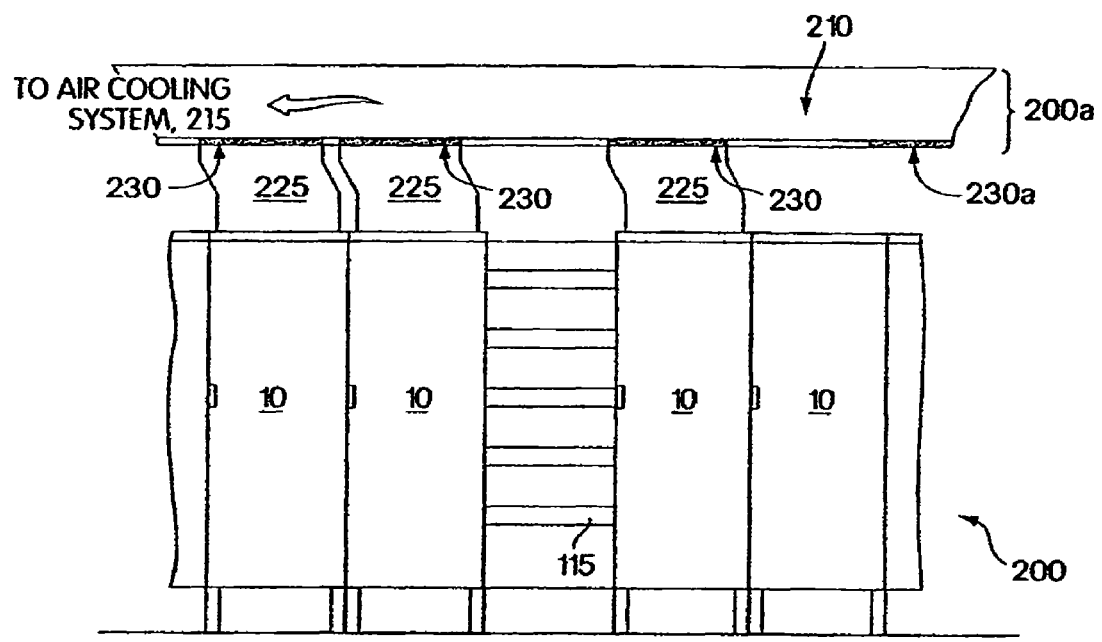
FIG. 10 is a view of a row of racks and/or enclosure with some racks and/or enclosures having the fan unit as shown in FIG. 8.

Referring to FIG. 10, the fan unit 10 is configured for providing flexibility to meet cooling requirements of equipment as equipment needs change or new equipment needs arise. The fan unit 10 can be installed to a certain rack or enclosure as required to meet the specific cooling requirements of the equipment in the rack. The fan unit 10, in particular, is constructed and arranged for quick and easy connection to and detachment from a rack or enclosure and, in particular, a rack or enclosure that experiences thermal problems and/or has a relatively high power load and, consequently, a relatively high thermal exhaust air output. The fan unit 10, thus, is configured to provide flexibility with respect to overcoming local thermal problems within an equipment room 200 without reconfiguration of the equipment room 200 and without substantial retrofitting of the fan unit 10 and an external exhaust system, e.g., the overhead ceiling exhaust plenum 210 provided by the dropped ceiling 200a, to which the fan unit 10 is operatively connected. As shown in FIG. 10, the fan unit 10 can be selectively connected or mounted to racks and enclosures that have different cooling requirements from adjacent and proximate racks and enclosures to thereby provide efficiency and economy in cooling rack-mounted equipment and removing thermal exhaust air from the equipment.

In addition, the fan unit 10 is configured for portability and ease, e.g., needs one operator to detach the fan unit 10 from one rack or enclosure and to connect or mount the fan unit 10 to another rack or enclosure. As described above, the duct 225 is configured to removably detach the fan unit 10 from the plenum 210 or the ceiling 200a to either enable the fan unit 10 to be moved to a different rack or enclosure or to enable the enclosure 100 to which the fan unit 10 is connected to be moved to a different location in the equipment room 200 or to a different equipment room. Alternatively, the duct 225 can be detached from the ceiling 200a by removing the ceiling tile 230 to which the duct 225 is connected from a ceiling grid 230a to either enable the fan unit 10 to be moved to a different enclosure or to enable the enclosure 100 to which the fan unit 10 to be moved to a different location.

One or more of the housing 12, the exhaust ducts 20 and the fans 18 is preferably constructed of a material suitable for use with equipment that produces heat during its operation and for use with a particular air, e.g., air, that circulates and/or is removed from the equipment. Suitable materials include, but are not limited to, metals, e.g., steel and aluminum, plastics, e.g., polyethylene and polypropylene, plastic resins, and combinations of such materials.

Referring to FIG. 7, to supply power to the fans 18, the housing 12 can include dual power input having two power ports 102, 104 to provide electrical redundancy. The two power ports 102, 104 are connected to three switches 106, 108 and 110 (shown in phantom), via fail-over circuitry 112 (shown in phantom). The fail-over circuitry 112 couples each switch 106, 108 and 110 to one of the fans 18. The fail-over circuitry 112 and the switches 106, 108 and 110 can be disposed in the housing 12.

The power ports 102, 104 are configured to receive power cord connectors, e.g., standard three-prong connectors, or other connectors as appropriate for the power being supplied. The fail-over circuitry 112 is configured to connect one of the ports 102, 104 to the three switches 106, 108 and 110 in a normal mode. Actuating/de-actuating buttons 121, 122 and 123 for turning the fans 18 on and off can be associated with the fan switches 106, 108 and 110. Actuation of the buttons 121, 122 and 123 causes the fan switches 106, 108 and 110 to close and thereby to couple the fail-over circuitry 112 to the fans 18 to provide electrical power when the fan unit 10 is powered up. De-actuation of the buttons 121, 122 and 123 causes the fan switches 106, 108 and 110 to break the circuitry 112 coupled with the fans 18.

The circuitry 112 is further configured to detect a failure in power supply and to switch between alternate power sources. The circuitry 112 can be configured to detect a failure in power supply from the port 102 and, in response, to couple the port 104, e.g., connected to an alternate power source, to the switches 106, 108 and 110 to supply power from the port 104. An indication (not shown), e.g., an LED display, can indicate detection of a power supply failure and the port 102, 104 from which power is being supplied to the fan unit 10.

In addition, the circuitry 112 is further configured to provide dual independent fusing of the fans 18, such that if one of the fans 18 fails, then only the other of the fans 18 will receive operating power. The circuitry 112 also provides independent thermal protection of the fans 18. If the winding of any of the fans 18 gets too hot, then the circuitry 112 will shut that fan 18 off. An indication, e.g., an LED display, can be provided to show the fans 18 that have been shut off.

The switches 106, 108 and 110 and respective buttons 121, 122 and 123 can be used for selecting which, or all three, of the fans 18 will operate when the fan unit 10 is powered up. Pressing on the button will actuate/de-actuate the respective switches 106, 108 and 110. The buttons 121, 122 and 123, or separate selectors, can provide for selecting the speed settings for each or all three of the fans 18.

Figure 11:
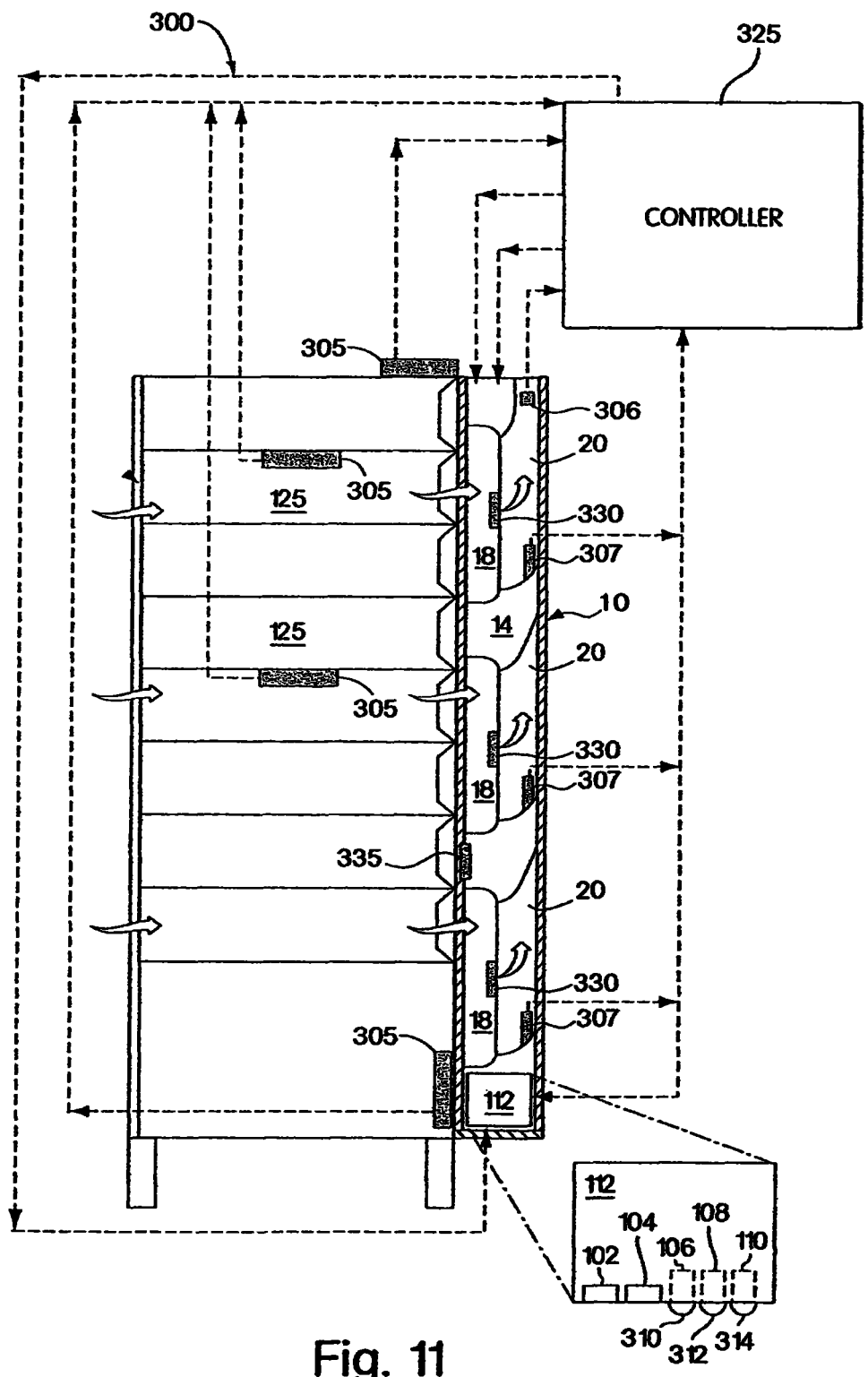
FIG. 11 is a schematic view of a fan speed control system based on rack power load of the fan unit shown in FIGS. 4 and 8.

Referring to FIG. 11, the fan unit 10 further includes a fan speed control system 300 to control fan speed in response to electrical power drawn by equipment in the rack 115 or a power load of the rack 115. Electrical power drawn by the rack-mounted equipment 125 or the power load of the rack 115 relates to the thermal output of equipment components in the rack 115 and the consequent thermal exhaust air produced by the components during operation. The fan speed control system 300, therefore, is based upon the power load of the rack 115 to help control a rate of air flow to the equipment 125 and helps to prevent the fans 18 from drawing exhaust air at a rate greater or less than required to cool the equipment.

A user of the fan unit 10 may know and/or can determine empirically a power load of the rack 115, which can vary depending upon the type and the number of components mounted in the rack 115. A user, thus, can assess a thermal output and air flow rate requirements of the rack 115 and fan speed to provide a sufficient air flow rate to remove thermal exhaust air from the rack 115 and the fan unit 10. The fan speed control system 300 can be configured to permit a user of the fan unit 10 to set and/or to adjust the speed of each of the fans 18 manually. The system 300 can include speed selectors 310, 312 and 314 wherein each speed selector 310, 312 and 314 is coupled by the fail-over circuitry 112 to its respective fan 18. The speed selectors 310, 312 and 314 are configured to permit a user to manually select a speed setting for each, or for all three, of the fans 18.

In addition, the control system 300 can be configured to provide selection and/or adjustment of fan speed before and during operation of the fan unit 10 through automatic control. The control system 300 can include one or more measurement devices 305 to measure a power load of the rack 115 and a remote programmable controller 325, e.g., a PC-type computer or a programmable microprocessor, to provide automatic fan speed selection and adjustment. The one or more measurement devices 305, e.g., current sensors or voltage sensors, can be disposed in the rack 115 and/or contained within the enclosure 100, and operatively coupled to the controller 325. The sensors 305 measure electric current drawn by the equipment 125 in the rack 115 at a given time during operation of the fan unit 10 to provide a measured value of rack power load, and/or a measured value of electric current drawn by individual components or groups of components. The sensors 305 can be configured to transmit one or more signals representative of one or more measured values of rack power load to the controller 325. The controller 325 can be configured to receive the one or more signals from the sensors 305. The controller 325 can be programmed with standards or values of one or more operation variables of the fan unit 10 including rack power load values and correlating air flow rate (cfm) values to accommodate thermal output of the equipment. The controller 325, in response to receipt of one or more signals from the sensors 305, can transmit one or more speed-control signals to the speed selectors 310, 312 and 314 of the fail-over circuitry 112 and/or to a signal input 330 of each fan 18 to set and/or to adjust fan speed. The controller 325 can be further programmed to set and/or to adjust a speed of each fan 18 individually and independently of the other fans 18, or to set and/or to adjust a speed of all three fans 18 simultaneously.

In embodiments of the invention, the controller 325 may be contained in the rack 115 or contained in the enclosure 100, or may be located remotely from the fan unit 10 in or outside an equipment room or data center.

In one embodiment, fan-speed control and adjustment is controlled by causing the input power signal to the fans 18 to effectively skip voltage line cycles to lower power supplied to the fans 18. Under this control scheme, when the fans 18 operate at low speeds, repeated acceleration of the fans 18 can cause an inrush of current which in turn can cause heat build up within the rack 115 and undesirable power load characteristics. In one embodiment, series capacitors are provide to reduce the inrush of current.

The control system 300 can include an indication, e.g., an LED display, disposed in the fan unit 10 and/or disposed in the controller 325 that is configured to display information, for instance, a measured value of a power load of the rack 115, a speed of each fan 18 and/or a status of operation, e.g., "on"/"off", of each fan 18. The controller 325 can be further programmed to provide output signals to the LED display to indicate the information.

The control system 300 can further include a sensor 335 disposed in the fan unit 10 and operatively coupled to a portion of the fan unit 10, e.g., the latch 15 configured to help couple and to securely fasten the fan unit 10 to the enclosure 100. The sensor 335 is configured to detect a status of the fan unit 10 as either "open", e.g., the fan unit 10 is not coupled to the enclosure 100 and provides access to the rack 115, or "closed", e.g., the fan unit 10 is secured to the enclosure 100. The sensor 335 detects the status of the fan unit 10 and transmits one or more signals representing the status of the fan unit 10 to the controller 325. The controller 325 can be further programmed to receive the signals from the sensor 335 and to transmit, in response to the status of the fan unit 10, one or more speed-control signals to the fans 18 to adjust fan speeds. For example, the sensor 335 can detect the status of the fan unit 10 as "open" and transmit one or more signals to the controller 325 indicating that the fan unit is "open". In response to receiving one or more signals indicating an "open" status of the fan unit 10, the controller 325 can respond by sending one or more speed signals to one or more of the signal inputs 330 of the fans 18 to increase speed of one or more of the fans 18 to a maximum or full capacity (cfm). In this case, one or more of the fans 18 increases its speed to operate at full capacity to help draw local hot and warm exhaust air from the rack 115 and to help force local hot and warm exhaust air into the ducts 20. In contrast, for example, the controller 325 can send one or more speed control signals to one or more of the signal inputs 330 to decrease speed or discontinue operation of one or more of the fans 18 when the fan unit 10 is "open". Decreasing or discontinuing operation of the fans 18 helps to prevent cool air from exhausting into the fan unit 10 and the ceiling plenum 210.

In addition, the controller 325 can send one or more speed signals to one or more of the signal inputs 330 of the fans 18, in response to receiving one or more signals the sensor 330 transmits to indicate a "closed" status, to begin or to resume operation of one or more of the fans 18 at a speed at which the fan 18 was previously operating or at a new speed. The controller 325 can be further programmed to indicate, e.g., via an LED display, the status of the fan unit 10.

Figure 1:
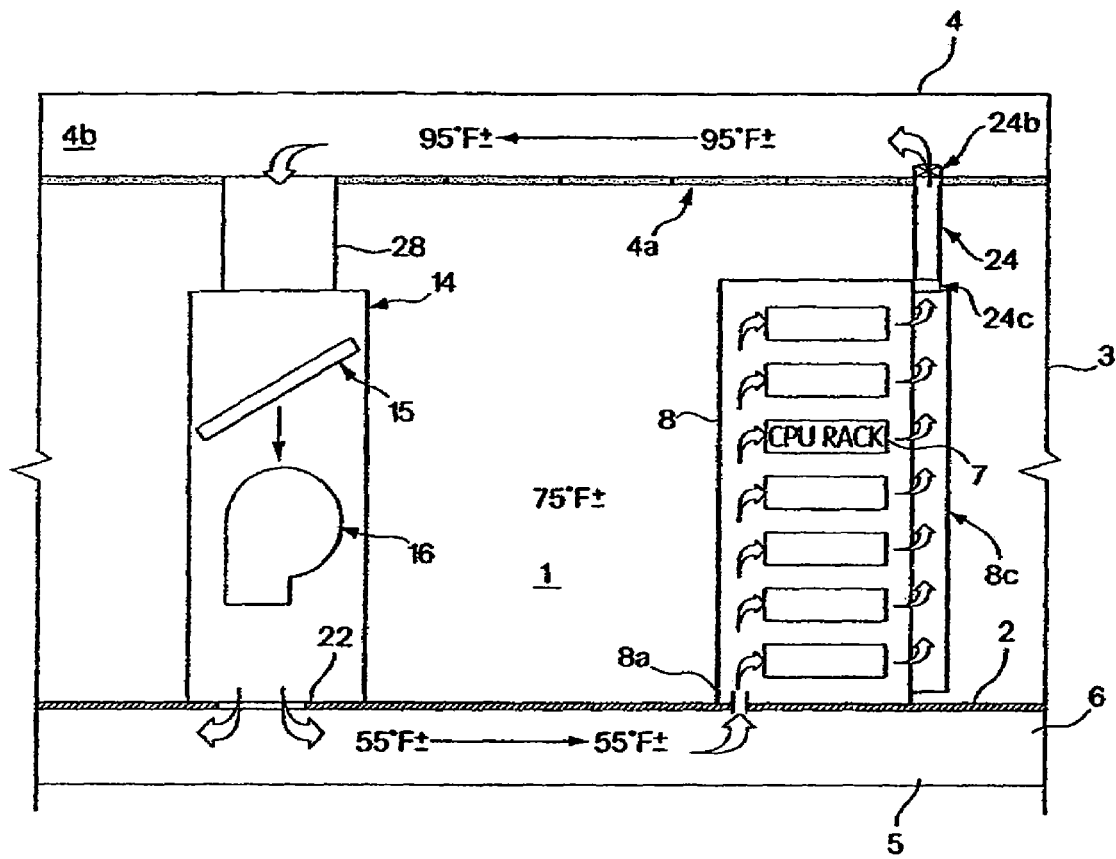
FIG. 1 illustrates a prior art air conditioning cooling system of a conventional equipment room including a double or raised floor having an air passageway.

As shown in FIG. 1, one or more pressure sensors 307 can be disposed in the fan unit 10 to detect a presence of and/or a change in fan-exhausted air flow in order to indicate or to provide feedback about operation of the fans 18. One or more pressure sensors 307 can be disposed in each of the ducts 20 mated with each of the fans 18 in order to detect pressure of air exhausted by the fans 18 and channeled through the ducts 20 toward the exhaust port 16. A change in pressure of fan-exhausted air flow in the duct 20 can be an indication that the respective fan 18 is not operative or not operating as required. The pressure sensor 307 can be further configured to transmit one or more signals to, for instance, the controller 325. The controller 325 can be further configured to receive the one or more signals and to indicate, e.g., via an LED display, information provided by the signals, e.g., a detected pressure of the fan-exhausted air in the respective duct 20. In addition, or alternatively, the pressure sensor 307 can send one or more signals to an indication, e.g., an LED display, disposed in the fan unit 10 and/or in the fail-over circuitry to indicate a change in pressure of fan-exhausted air in the respective duct 20.

As shown in FIG. 11, the fan unit 10 can further include a smoke detection system including one or more smoke detection sensors 306 operatively connected to the controller 325. The smoke detection sensor 306 is disposed in the fan unit 10, e.g., in a path of exhaust air vented by the fans 18, and is configured to detect smoke present in exhaust air vented from the equipment 125. Upon detection of smoke, the sensor 306 transmits one or more signals indicating a presence of smoke in exhaust air to the controller 325. The controller 325 can be further programmed to receive signals from the smoke sensor 306 and to transmit, in response to the one or more signals indicating the presence of smoke, one or more speed-control signals to the speed selectors 310, 312 and 314 of the fail-over circuitry 112 that actuate/de-actuate the fan switches 106, 108 and 110, respectively, to discontinue operation of one or more of the fans 18. In addition, or alternatively, the one or more speed-control signals can be sent to the signal input 330 of each fan 18 to discontinue operation of one or more of the fans 18. In addition, upon receipt of the one or more signals from the smoke detector sensor 306, the controller 325 can be further configured to provide an indication, e.g., an audible alarm and/or an LED display disposed in the controller 325 and/or in the fan unit 10, of a detection of smoke and/or of the status, e.g., "on"/"off", of one or more of the fans 18.

Figure 12:
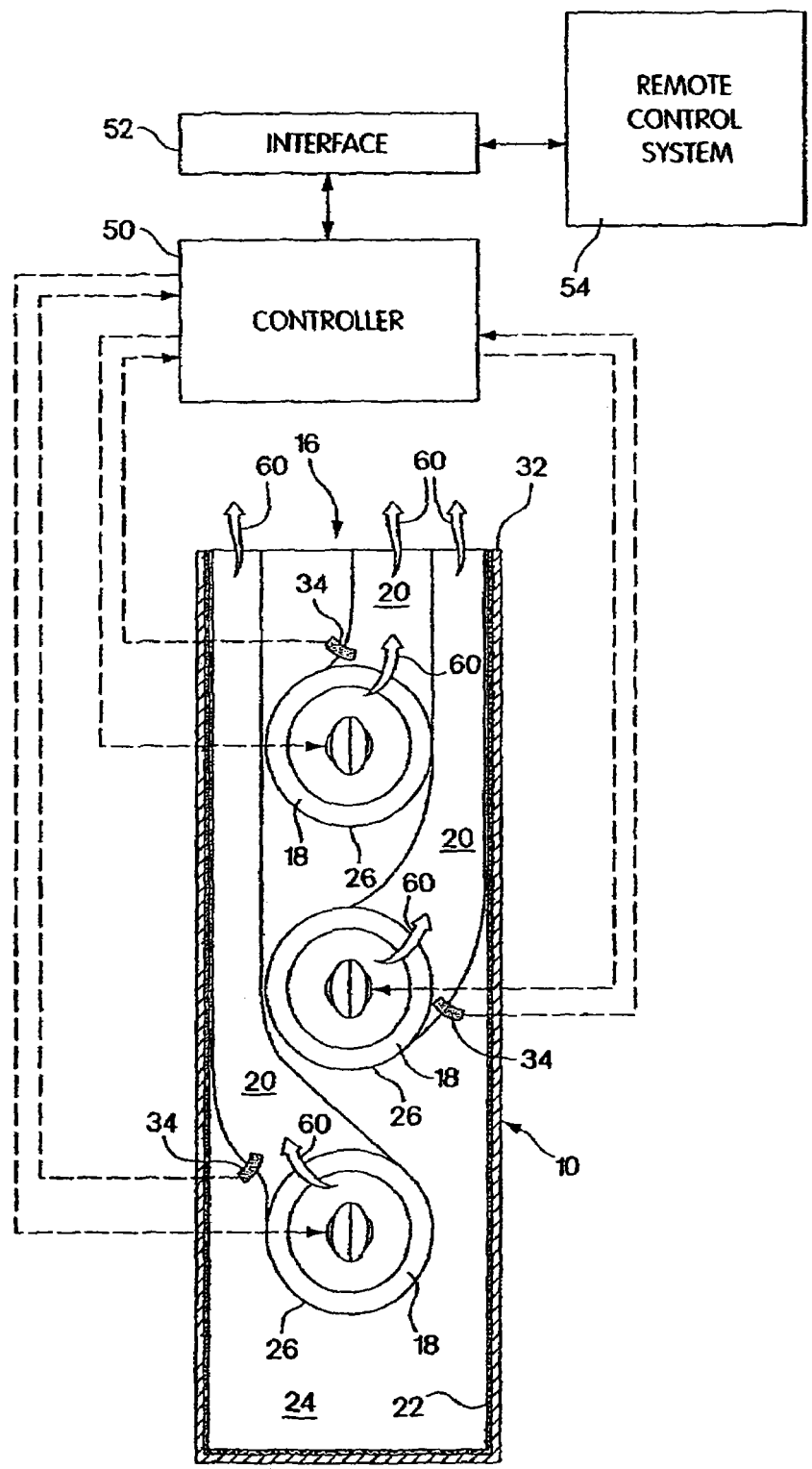
FIG. 12 is a schematic view of a fan speed control system based on equipment temperature of the fan unit shown in FIGS. 4 and 8.

Referring to FIG. 12, the fan unit 10 can further include a temperature system to detect a temperature of the interiors of the servers 125 and the enclosure 100. The temperature system includes multiple sensors 34. Each sensor 34 can be disposed within the housing 12 to detect a temperature of drawn-in and/or fan-exhausted air. For example, one or more of the sensors 34 may be located proximate to one or more of the ports 26 to detect a temperature of drawn-in air. One or more of the sensors 34 may be located in one or more of the ducts 20 proximate to one or more of the fans 18 to detect a temperature of fan-exhausted air.

The temperature system may further include a controller 50. The controller 50 can be configured to help maintain the temperature of the air around the servers 125 substantially constant. The controller 50, e.g., a PC-type of computer or a programmable microprocessor, can be operatively coupled to each sensor 34 to control operating speeds of the fans 18 in response to temperatures detected by the sensors 34. The controller 50 and the controller 325 discussed above may be implemented using one controller, located within the enclosure or separate from the enclosure. Upon detection of a temperature of drawn-in and/or fan-exhausted air, the sensor 34 can be configured to send signals to the controller 50. The controller 50 can receive the signals from the sensors 34 and determine whether one or more detected temperatures deviate from a desirable range of internal temperature(s) of the servers 125 and/or the enclosure 100. If one or more detected temperatures are not within a range of desired temperature (s), the controller 50 can send appropriate speed-control signals to appropriate fans 18 to increase or decrease fan speed and thereby to increase or decrease air flow produced by the fans 18.

For example, if one or more detected temperatures are above a desired range of temperature(s), then the controller 50 can increase the speeds of the appropriate fans 18, and preferably at least the fan 18 corresponding to the elevated temperature, to increase air flow into the front side 130 of the rack 130, across the servers 125 and from the server exhaust ports 120 into the interior region 46 of the fans 18 and the ducts 20. Increased air flow increases a rate of removal of hot and warm air from the servers 125 and the enclosure 100 and lowers an internal temperature. Alternatively, if one or more detected temperatures are below a desired range of temperature(s), the controller 50 can reduce the speeds of the appropriate fans 18 to decrease air flow and, thus, to increase internal temperature (s) of the servers 125 and the enclosure 100.

The controller 50 may be programmed to control and maintain air flow by controlling the fans 18 to operate at about the same speed or different speeds. The speeds of each fan 18 may be relative to one or more detected temperatures of drawn-in and/or fan-exhausted air. Varying speeds of the fans 18 helps to remove and prevent hot spots in the servers 125 and the enclosure 100. The temperature system may be programmed and operated remotely through an interface 52 that operatively connects the temperature system to a remote control system 54. The remote control system 54 may be programmed to monitor and to control multiple internal and external environmental conditions of the servers 125 and the enclosure 100.

Referring to FIGS. 2-2A, 5A-5B, 7 and 11, assembly and placement of the exhaust air fan unit 10 is relatively simple, can be performed quickly, and facilitates disassembly for repair or replacement of parts. The fans 18 are screwed to the wall 24 of the housing 12. The housing 12 with the mounted fans 18 is aligned with at least a portion of a perimeter of the enclosure 100 to couple the housing 12 to the enclosure 100. The housing 12 is preferably connected to the enclosure 100 with connectors 13, e.g., one or more hinged devices, such that the fan unit 10 serves as part of a door of the enclosure 100. The hinged devices 13 can permit the fan unit 10 to open from a first side and to pivot at another side at which the hinged devices are disposed to help allow the fan unit 10 to open away from the enclosure 100 in a door-like manner and to provide access to the interior of the enclosure 100. The first side of the fan unit 10 can include a fastener 15, e.g., a latch device, to help secure and to close the fan unit 10 to the enclosure 100 by mating or coupling to a corresponding fastener 15 provided by the rack 115 and/or the enclosure 100. The housing 12 is preferably connected to a side of the enclosure 100 from which the back side 110 of the rack 115 is accessible. Power cords are connected to the power ports 102, 104, preferably to couple an AC power source, e.g., a wall socket or an uninterruptible power supply outlet, to the port 102, and to couple a battery to the port 104. The sensors 305 can be operatively connected to the controller 325. The exhaust port 16 of the housing 12 can be connected to the plenum 210 via connection to the duct 225, and thereby connected to an air conditioning or cooling system, as described above.

Figure 13:
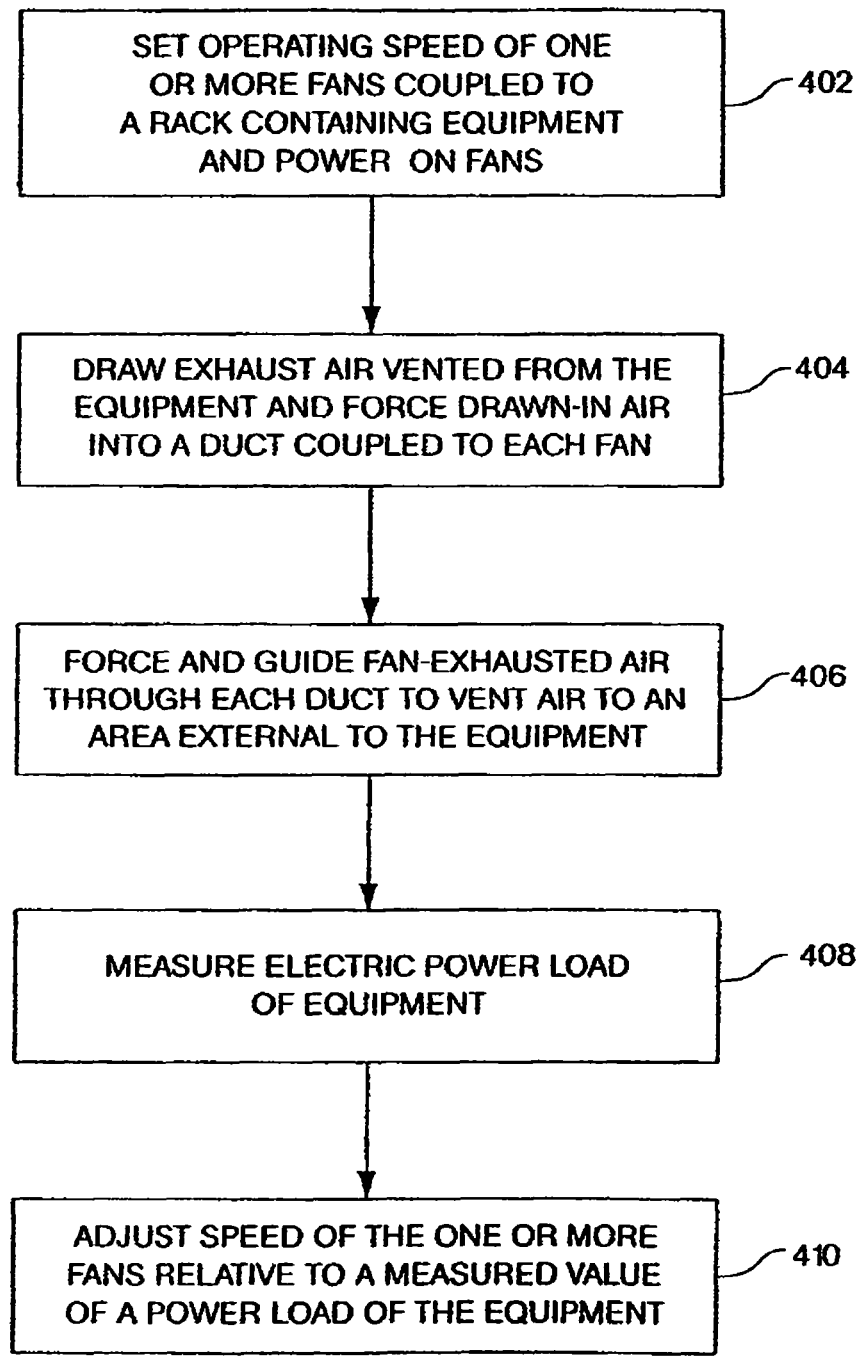
FIG. 13 shows a process for exhausting air from equipment.

In operation, referring to FIG. 13, with further reference to FIGS. 2-2A, 4, 7 and 11, a process 400 for exhausting air from the equipment 125, e.g., servers, and the enclosure 100 using the exhaust air fan unit 10 includes the stages shown. The process 400, however, is exemplary only and not limiting. The process 400 can be altered, e.g., by having stages added, removed or rearranged.

At stage 402, a user selects a speed at which each fan 18 should operate by manually setting each fan 18 to a desired speed or by selecting or entering a desired fan speed in the controller 325. The fan unit 10 is powered on to exhaust air from the equipment 125 and the enclosure 100.

At stage 404, the rings 42 of fan blades turn, thereby drawing air through the rings 42. The actions of the fans 18 draw exhaust air from the exhaust ports 117 of the equipment 125 and from the exhaust area 111b into the interior regions 46 of the fans 18. Drawn-in exhaust air is forced by the fans 18 from the interior regions 46 by the fins or blades 44 into the ducts 20 of the fan unit 10. The drawing actions of the fans 18 help to lower a pressure in the exhaust area 111b, which thereby reduces pressure differences between the inlet side 115a and the vent side 115b of the rack 115 and helps to facilitate the equipment's 125 ability to operate effectively, e.g., to draw sufficient cool air through the vents 118 and into the equipment 125 to help to maintain an internal temperature of the equipment 125 within a range of desired temperature (s).

At stage 406, the fans 18 push fan-exhausted air through the internal exhaust ducts 20 while the ducts 20 guide and channel fan-exhausted air substantially directly upward away from the fans 18 to the exhaust port 16. The exhaust port 16 vents fan-exhausted air to an area external to the housing 12 and the enclosure 100, e.g., ambient air space of a room containing the enclosure 100, or to the plenum 210, e.g., disposed in a dropped ceiling 200a, to return air to the air cooling system 215 operatively coupled to the plenum 210.

At stage 408, one or more of the sensors 305 detects electric power drawn by the equipment 125 in the rack 115. The one or more measured values of power load determine whether the speeds of one or more of the fans 18 are to be increased and/or decreased, e.g., via the controller 50 receiving the one or more measured values of power load and the controller 50 determining whether the air flow rate provided by the fans 18 should be increased or decreased to accommodate the measured thermal exhaust air output.

At stage 410, the speeds of one or more appropriate fans 18 are increased and/or decreased, e.g., via the controller 50 sending appropriate speed-control signals to respective inputs of the appropriate fans 18, relative to the one or more measured values of power load of the rack 115 to thereby increase and/or decrease a rate of air flow from the servers 125 and the enclosure 100.

Various advantages and/or benefits of the invention are provided. When connected to the enclosure 100 and/or the rack 115, the fan unit 10 according to the invention helps to enable the rack-mounted equipment 125, e.g., servers, to operate effectively to draw sufficient ambient air into the rack 115, e.g., via fans in the equipment 125, to help cool the equipment 125 to within a desired range of temperature(s). By removing and containing exhaust air vented by the equipment 125, the fan unit 10 helps to allow the equipment 125 to operate effectively. The equipment 125 draws sufficient ambient air from the equipment room 200 to meet its cooling requirements and thereby avoids a need for cooling air at low temperatures, e.g., 55 .degree. F., to reduce its operating temperatures.

As shown in FIG. 1, prior art cooling systems and methods that supply cooling air directly into a rack 8 to meet cooling requirements of equipment 7 typically rely on a closed air circulation system and method to cool and to supply cold air directly into the rack 8. Such systems and methods typically employ a double or raised floor construction to maintain a relatively low temperature of cooling air and to supply cooling air directly into the rack 8. Cooling air, therefore, must be sufficiently cold, e.g., 55 .degree. F., in order to dilute hot and warm exhaust air returned to the air cooling unit 14 (for cooling and recirculating to the rack 8), and to effectively lower operating temperatures of the equipment 7.

Air cooling units used with raised floor systems and methods that provide cooling air at low temperatures of 55 .degree. F. have relatively high energy requirements and can be expensive to operate and to maintain. In addition, cooling air at temperatures of about 55 .degree. F. can produce undesirable effects. For instance, systems and methods that cool air to 55 .degree. F. supply cold air with a low moisture content that typically requires moisture to be added to provide air with sufficient humidity for use in equipment rooms and data centers. Systems and methods that cool air to 55 .degree. F. can typically produce relatively large volumes of water condensate that must be removed from equipment rooms and data centers and, thus, increase equipment operating and maintenance costs.

Raised floor systems and methods are typically physically inflexible to meet new and changing equipment needs within an equipment room and may require reconfiguration of the equipment room and/or rearrangement and/or replacement of racks and/or enclosures.

In contrast, the fan unit 10 according to the invention and the exhaust system in which the fan unit 10 can be integrated, as described above with reference to FIGS. 2-2A, help to enable use of ambient air by the equipment 125 to meet its cooling requirements. The fan unit 10 and the exhaust system help the equipment 125 operate effectively to draw sufficient ambient air, e.g., ranging from about 60 .degree. F. to about 70 .degree. F., and preferably from about 60 .degree. F. to about 65 .degree. F., to meet its cooling requirements.

By removing and containing exhaust air vented from the equipment 125, the fan unit 10 helps to enable the equipment 125 to operate effectively to cool itself during operation, e.g., by drawing a sufficient amount of air from ambient air space of the equipment room 200. As described above with reference to FIGS. 2-2A, the fan unit 10 helps the equipment 125, e.g., fans in the equipment 125, overcome resistance to air flow through the rack 115 at the inlet side 115a of the rack 155. The fan unit 10 helps to eliminate or to at least minimize/reduce backpressure at the vent side 115b of the rack 115 to help fans in the equipment 125 vents exhaust air. In addition, by removing exhaust air and thereby lowering pressure at the vent side 115b of the rack 115, the fan unit 10 can help to eliminate or to at least minimize/reduce pressure differences between the inlet side 115a and the vent side 115b of the rack 115 that are created as a result of air flow resistance. The fans in the equipment 125 can then operate effectively during operation to draw sufficient air into the equipment 125 to cool the equipment 125 without a need to overcome air flow resistance. The fan unit 10, thereby, helps to prevent heat build-up and hot spots within the enclosure 100 and the rack 114 by enabling the equipment 125 to operate effectively to cool.

In addition, by removing and containing exhaust air, the fan unit 10 helps to eliminate a need for cooling air at low temperatures, e.g., 55 .degree. F., to lower operating temperatures of the equipment 125 and/or to dilute exhaust air vented to the plenum 210. Rather, cooling requirements of the equipment 125 can be met with ambient air. Eliminating a need for cooling air at relatively low temperatures, e.g., 55 .degree. F., the cooling system 215 of the exhaust system with which the fan unit 10 can be integrated, as shown in FIGS. 2-2A, can be configured to cool and to supply air to the equipment room 200 in a range of about 60 .degree. F. to about 70 .degree. F. The cooling system 215 consequently produces little or no water condensation during operation. When the cooling system 215 supplies air at about 65 .degree. F., the air has sufficient humidity for use in the equipment room 200 and no moisture needs to be added.

The fan unit 10 also helps to prevent or to at least minimize/reduce mixing of hot and warm exhaust air with ambient air of the equipment room 200. The fan unit 10 also helps to prevent or to at least minimize/reduce undesirable recirculation of exhaust air to the inlet vents 118 of the enclosure 100 and/or to the inlet side 115a of the rack 115. The fan unit 10 can further help to minimize/reduce a thermal gradient of inlet temperatures of ambient air drawn into the rack 115 such that air drawn into a top portion and air drawn into a bottom portion of the rack 115 have substantially similar inlet temperatures.

In addition, by removing and venting exhaust air from the equipment 125 and/or from the equipment room 200, the fan unit 10 raises temperatures of exhaust air returned to the cooling system 215, e.g., via the dropped ceiling plenum 210. Higher temperatures of return air help to increase an efficiency of operation of the air cooling system 215 and help to reduce a need for humidification of air circulated to a room in which the enclosure 100 is located. Temperature of air supplied to the air cooling system 216 similarly can be higher. Higher temperatures of supply air and return air help to improve and to increase an efficiency of the air conditioning system 215, thereby helping to maintain low operating costs.

Control of a rate at which the fan unit 10 removes and vents exhaust air from the enclosure 100 and/or the equipment room 200, e.g., via fan-speed, can be based on a power load of the equipment 125 in the rack 115. As a power load of the equipment 125 relates to the thermal output of the equipment 125, operating fan-speeds of the fans 18 are varied to help prevent the fans 18 from operating at a rate greater or less than a rate required to help the equipment 125 cool itself. Controlling fan speed, therefore, helps to avoid increasing/decreasing air flow through the rack 115 to an undesirable rate. Controlling fan speed can also help to eliminate or to at least minimize/reduce a risk of placing a burden on the cooling system 215 and exceeding its capacity to handle large volumes of return air such that the cooling system's 215 efficiency is reduced. In addition, in the context in which the fan unit 10 is connected to the plenum 210 via connection to the dropped ceiling 200a or connection to the ceiling tile 230, controlling fan speed and thereby controlling a rate at which air is exhausted through the duct 225 helps to prevent dislodging portions of the ceiling 200a or the ceiling tile 230 during operation of the fan unit 10.

Temperature control, as described above, can be suitable for communications and information technology equipment that is housed in one or two racks and/or rack enclosures. In this context, the fan unit 10 can be connected to a comfort air conditioner or system that provides cool air to an equipment room in which the enclosure 100 is located as well as other areas of a location. When a temperature setting of the air conditioner is changed or adjusted, e.g., on week-ends when a need for cool air for comfort is reduced, the fan unit 10 can respond to the change or adjustment of the temperature setting by increasing and/or decreasing speed of the fans 18 to change or adjust air flow rate into the enclosure 100 to thereby accommodate the changed or adjusted temperature setting.

Other embodiments are within the scope and spirit of the appended claims. For example, other numbers of fans such as only one fan, or more than three fans, may be used in the fan unit 10. A single power source can be coupled to the fan unit 10. The fan unit 10 can be configured for use with any type of and/or size of rack or enclosure that contains and/or supports equipment.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. A cooling system comprising:
   an equipment rack configured to support one or more pieces of rack-mounted equipment within an interior of the equipment rack, the equipment rack including a front to receive the rack-mounted equipment therein;
   an exhaust fan unit mounted on an equipment rack of an enclosure, the exhaust fan unit including a fan and an exhaust duct coupled to the fan, the exhaust fan unit being configured to direct air heated by rack-mounted equipment supported by the equipment, the exhaust fan unit including a temperature system to detect a temperature of the interior of the equipment rack, the temperature system including one or more sensors positioned within the interior of the equipment rack;
   an overhead plenum in fluid communication with the exhaust duct of the exhaust fan unit;
   a cooling unit in fluid communication with the overhead plenum, the cooling unit including a heat exchanger and an exhaust assembly, the cooling unit being configured to direct cooled air to the front of the equipment rack; and
   a controller operably coupled to the exhaust fan unit, the controller being configured to control the operation of the exhaust fan unit in response to temperatures detected by the one or more sensors.

2. The cooling system of claim 1, wherein the enclosure further includes a back, two sides, a top and a bottom, and wherein the exhaust fan unit is mounted on the back of the enclosure.

3. The cooling system of claim 2, wherein the exhaust duct of the exhaust fan unit is configured to exhaust heated air toward the top of the enclosure.

4. The cooling system of claim 3, wherein the exhaust duct is configured to provide fluid communication between the exhaust duct of the exhaust fan unit and the overhead plenum.

5. The cooling system of claim 2, wherein the exhaust fan unit forms a back door of the enclosure.

6. The cooling system of claim 1, wherein the exhaust fan unit includes a housing configured to support the fan and the exhaust duct.

7. The cooling system of claim 6, wherein the exhaust fan unit includes several fans.

8. The cooling system of claim 1, wherein the heat exchanger includes a cooling coil.

9. The cooling system of claim 8, wherein the exhaust assembly includes at least one fan.

10. The cooling system of claim 1, further comprising an intake duct connected to the plenum and the cooling unit, the intake duct being configured to direct heated air from the plenum to the cooling unit.

11. The cooling system of claim 1, further comprising an intake duct connected to the exhaust duct of the exhaust fan unit and the plenum.

12. The cooling system of claim 1, wherein the cooling unit further includes a cooling unit housing spaced from the equipment rack, the cooling unit housing being configured to support the heat exchanger and the exhaust assembly.

13. The cooling system of claim 1, wherein the controller is further configured to receive signals from the one or more sensors and to determine whether one or more detected temperatures deviate from a desirable range of temperatures within the interior of the equipment rack.

14. The cooling system of claim 13, wherein the controller is further configured to send signals to the exhaust fan unit in response to receiving signals of detected temperatures to increase or decrease an operational speed of the fan of the exhaust fan unit.

* * * * *